United States Patent
Lee et al.

(10) Patent No.: US 10,557,197 B2
(45) Date of Patent: Feb. 11, 2020

(54) MONOLITHIC GAS DISTRIBUTION MANIFOLD AND VARIOUS CONSTRUCTION TECHNIQUES AND USE CASES THEREFOR

(71) Applicant: Lam Research Corporation, Fremont, CA (US)

(72) Inventors: Andrew C. Lee, Daly City, CA (US); Michael C. Kellogg, Oakland, CA (US); Christopher J. Pena, Hayward, CA (US); John E. Daugherty, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 223 days.

(21) Appl. No.: 14/884,575

(22) Filed: Oct. 15, 2015

(65) Prior Publication Data
US 2016/0108523 A1 Apr. 21, 2016

Related U.S. Application Data

(63) Continuation-in-part of application No. 14/517,192, filed on Oct. 17, 2014.

(51) Int. Cl.
*C23C 16/455* (2006.01)
*B24B 37/04* (2012.01)
*C23C 16/04* (2006.01)

(52) U.S. Cl.
CPC ...... *C23C 16/45525* (2013.01); *B24B 37/042* (2013.01); *C23C 16/042* (2013.01)

(58) Field of Classification Search
CPC ........ C23C 16/45525; C23C 16/45561; C23C 16/4409; C23C 16/4404; C23C 16/042; B24B 37/042
See application file for complete search history.

(56) References Cited

U.S. PATENT DOCUMENTS 4,420,142 A * 12/1983 Dworak ................ C04B 35/119
137/625.41
4,545,328 A 10/1985 Fujiyama et al.
(Continued)

FOREIGN PATENT DOCUMENTS

JP 2003-334479 A 11/2003
JP 2004-214591 A 7/2004
(Continued)

OTHER PUBLICATIONS

U.S. Office Action, dated Jun. 22, 2017, issued in U.S. Appl. No. 14/517,192.
(Continued)

*Primary Examiner* — Michael R Reid
(74) *Attorney, Agent, or Firm* — Weaver Austin Villeneuve & Sampson LLP

(57) ABSTRACT

A gas delivery substrate for mounting gas supply components of a gas delivery system for a semiconductor processing apparatus is provided. The substrate may include a plurality of layers having major surfaces thereof bonded together forming a laminate with openings for receiving and mounting first, second, third and fourth gas supply components on an outer major surface. The substrate may include a first gas channel extending across an interior major surface that at least partially overlaps a second gas channel extending across a different interior major surface. The substrate may include a first gas conduit including the first gas channel connecting the first gas supply component to the second gas supply component, and a second gas conduit including the second channel connecting the third gas supply component to the fourth gas supply component. Also disclosed are various techniques for manufacturing gas delivery substrates.

19 Claims, 18 Drawing Sheets

(56) References Cited

U.S. PATENT DOCUMENTS

| | | | |
|---|---|---|---|
| 4,703,718 A | 11/1987 | Enstrom | |
| 4,714,091 A | 12/1987 | Wagner | |
| 5,653,259 A * | 8/1997 | Ramstad | B01J 4/02 137/240 |
| 5,794,645 A | 8/1998 | Rohrberg et al. | |
| 5,836,355 A | 11/1998 | Markulec et al. | |
| 6,068,016 A | 5/2000 | Manofsky, Jr. et al. | |
| 6,073,646 A | 6/2000 | Kimura | |
| 6,125,887 A | 10/2000 | Pinto | |
| 6,168,948 B1 | 1/2001 | Anderson et al. | |
| 6,186,177 B1 | 2/2001 | Maher | |
| 6,260,581 B1 | 7/2001 | Hollingshead | |
| 6,283,143 B1 | 9/2001 | Adachi, Jr. et al. | |
| 6,283,155 B1 | 9/2001 | Vu | |
| 6,302,141 B1 | 10/2001 | Markulec et al. | |
| 6,352,594 B2 | 3/2002 | Cook et al. | |
| 6,440,504 B1 | 8/2002 | Akiyama | |
| 6,546,960 B1 | 4/2003 | Rohrberg et al. | |
| 6,581,640 B1 | 6/2003 | Barron | |
| 6,640,835 B1 | 11/2003 | Rohrberg et al. | |
| 6,648,020 B2 | 11/2003 | Fujimoto et al. | |
| 6,718,817 B1 | 4/2004 | Ko et al. | |
| 6,753,200 B2 | 6/2004 | Craighead et al. | |
| 6,880,745 B2 | 4/2005 | Stueber et al. | |
| 6,907,904 B2 | 6/2005 | Harris et al. | |
| 7,055,550 B2 | 6/2006 | Harris et al. | |
| 7,126,094 B2 | 10/2006 | Bower et al. | |
| 7,150,475 B2 | 12/2006 | Eriksson et al. | |
| 7,178,556 B2 | 2/2007 | Reid, II et al. | |
| 7,195,037 B2 | 3/2007 | Eidsmore | |
| 7,225,835 B2 | 6/2007 | Vu | |
| 7,234,222 B1 | 6/2007 | Hao et al. | |
| 7,261,812 B1 | 8/2007 | Karp et al. | |
| 7,299,825 B2 * | 11/2007 | Milburn | F17D 1/04 137/884 |
| 7,307,247 B2 | 12/2007 | Bower et al. | |
| 7,320,339 B2 | 1/2008 | Milburn | |
| 7,334,605 B2 | 2/2008 | Vu | |
| 7,404,417 B2 | 7/2008 | Eidsmore | |
| 7,410,519 B1 | 8/2008 | Ewald | |
| 7,789,107 B2 | 9/2010 | Eriksson et al. | |
| 7,798,388 B2 | 9/2010 | Crockett et al. | |
| 7,892,357 B2 | 2/2011 | Srivastava | |
| 7,976,795 B2 | 7/2011 | Zhou et al. | |
| 8,122,910 B2 | 2/2012 | Taskar | |
| 8,196,480 B1 | 6/2012 | Mayeaux | |
| 8,196,609 B2 | 6/2012 | Oya et al. | |
| 8,322,380 B2 | 12/2012 | Taskar | |
| 8,340,827 B2 | 12/2012 | Yun et al. | |
| 8,521,461 B2 | 8/2013 | Shareef et al. | |
| 8,746,284 B2 | 6/2014 | DeDontney | |
| 8,794,267 B2 | 8/2014 | Shareef et al. | |
| 8,846,183 B2 | 9/2014 | Unger et al. | |
| 8,851,113 B2 | 10/2014 | Taskar et al. | |
| 8,852,685 B2 | 10/2014 | Kenworthy et al. | |
| 2002/0017329 A1 | 2/2002 | Fukushima | |
| 2002/0072164 A1 | 6/2002 | Umotyo et al. | |
| 2003/0051620 A1 * | 3/2003 | Schafer | B41F 27/12 101/415.1 |
| 2003/0124842 A1 | 7/2003 | Hytros et al. | |
| 2004/0092118 A1 | 5/2004 | Johnson et al. | |
| 2004/0189311 A1 | 9/2004 | Glezer et al. | |
| 2005/0005981 A1 | 1/2005 | Eidsmore et al. | |
| 2005/0284529 A1 | 12/2005 | Iwabuchi | |
| 2007/0289652 A1 * | 12/2007 | Curran | F16K 27/003 137/884 |
| 2008/0053543 A1 * | 3/2008 | Baier | G01N 30/20 137/625.15 |
| 2008/0066859 A1 | 3/2008 | Kobayashi et al. | |
| 2012/0237696 A1 | 9/2012 | Huseinovic et al. | |
| 2013/0025718 A1 | 1/2013 | Nagase et al. | |
| 2013/0255782 A1 | 10/2013 | Shareef et al. | |
| 2013/0255883 A1 | 10/2013 | Shareef et al. | |
| 2014/0020779 A1 | 1/2014 | Vu | |
| 2014/0076236 A1 | 3/2014 | Sankarakrishnan et al. | |
| 2014/0090599 A1 | 4/2014 | Saitou | |
| 2014/0137961 A1 | 5/2014 | Kao et al. | |
| 2014/0182689 A1 | 7/2014 | Shareef et al. | |
| 2015/0187614 A1 * | 7/2015 | Gaff | H01J 37/32532 438/5 |
| 2015/0362080 A1 | 12/2015 | Vu | |
| 2016/0111257 A1 | 4/2016 | Kellogg et al. | |
| 2017/0057028 A1 | 3/2017 | Kellogg et al. | |
| 2017/0203511 A1 | 7/2017 | Burkhart et al. | |
| 2017/0204989 A1 | 7/2017 | Burkhart et al. | |

FOREIGN PATENT DOCUMENTS

| | | |
|---|---|---|
| KR | 10-2009-0125681 | 12/2009 |
| WO | WO 2014/199158 A1 | 12/2014 |
| WO | WO 2016/061493 A1 | 4/2016 |

OTHER PUBLICATIONS

U.S. Office Action, dated Dec. 30, 2016, issued in U.S. Appl. No. 14/997,419.

U.S. Final Office Action, dated Jul. 10, 2017, issued in U.S. Appl. No. 14/997,419.

U.S. Notice of Allowance, dated Sep. 27, 2017, issued in U.S. Appl. No. 14/997,419.

PCT International Search Report and Written Opinion dated Dec. 28, 2015 issued in PCT/US2015/0555997.

PCT International Preliminary Report on Patentability and Written Opinion dated Apr. 27, 2017 issued in PCT/US2015/0555997.

"MicroSeal™ Product Selection Guide," *Microflex Technologies*, (2004), 6 pages.

"Metal Seal Design Guide, High Performance Engineered Seals and Sealing Systems," *Parker Hannifin Corporation, Composite Sealing Systems Division*, (2013), 106 pages.

U.S. Final Office Action, dated Nov. 16, 2017, issued in U.S. Appl. No. 14/517,192.

Chinese First Office Action, dated Nov. 2, 2018, issued in Application No. 201580056443.5.

* cited by examiner

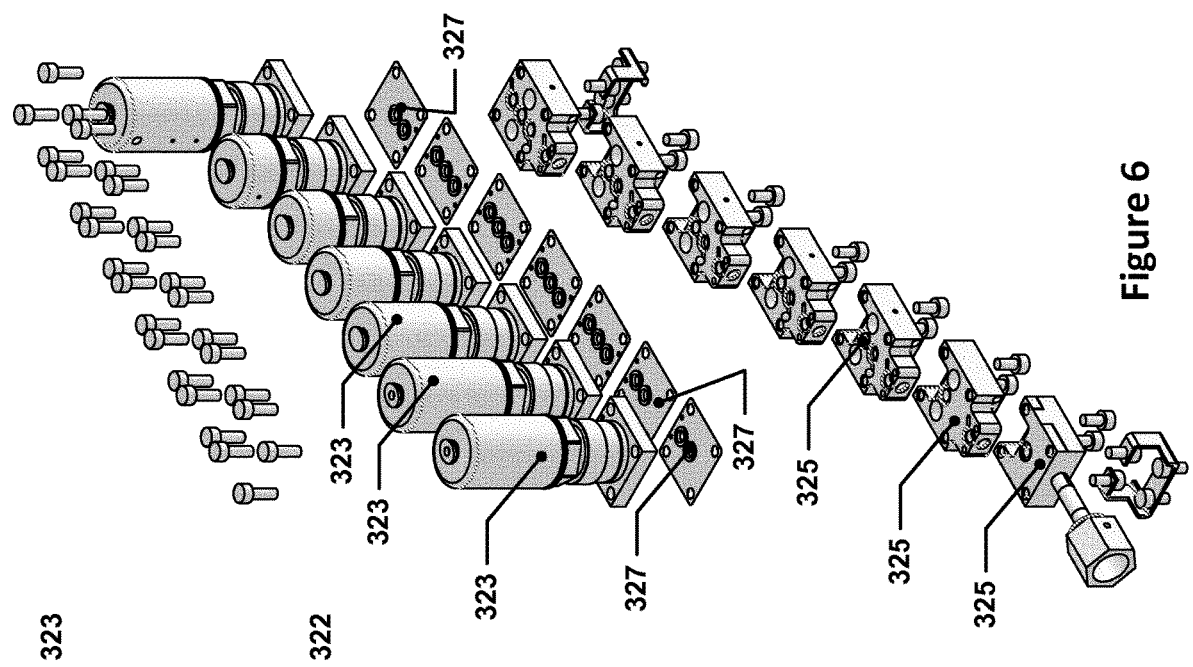
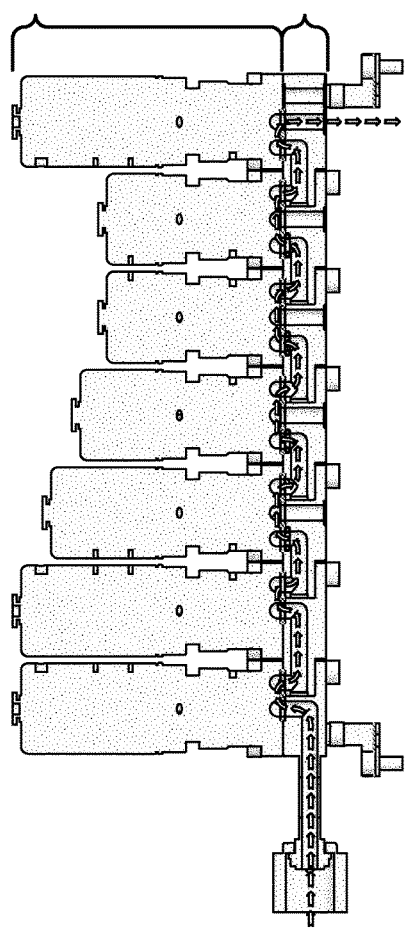
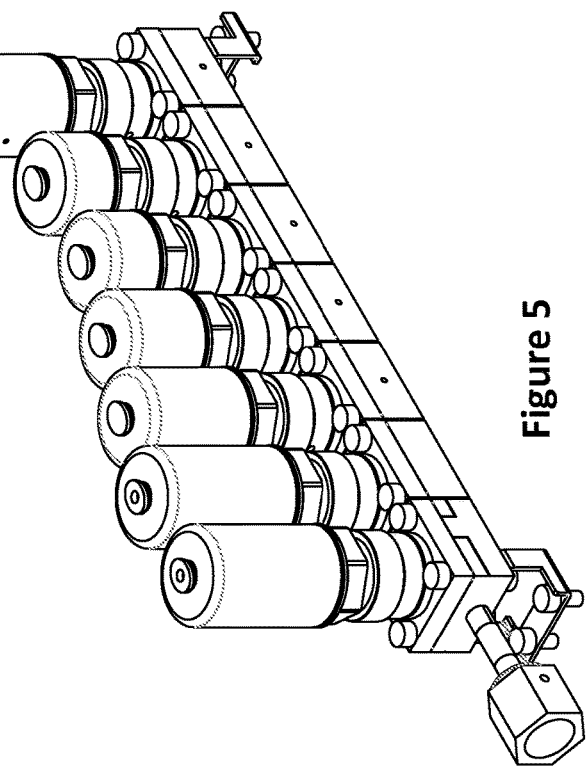

Hole Size Guide
- ○ 708
- ○ 710

MONOLITHIC GAS DISTRIBUTION MANIFOLD AND VARIOUS CONSTRUCTION TECHNIQUES AND USE CASES THEREFOR

CROSS-REFERENCE TO RELATED APPLICATIONS

This application is a continuation-in-part application claiming priority under 35 U.S.C. § 120 from pending U.S. patent application Ser. No. 14/517,192, filed on Oct. 17, 2014, titled "SUBSTRATE FOR MOUNTING GAS SUPPLY COMPONENTS AND METHODS THEREOF," which is hereby incorporated herein by reference in its entirety for all purposes.

FIELD OF THE INVENTION

The invention relates to gas delivery systems for semiconductor substrate processing apparatuses. More particularly, the invention relates to a gas delivery substrate for mounting gas supply components of a gas delivery system for a semiconductor processing apparatus.

BACKGROUND

Semiconductor substrate processing apparatuses are used for processing semiconductor substrates by techniques including, but not limited to, plasma etching, physical vapor deposition (PVD), chemical vapor deposition (CVD), plasma enhanced chemical vapor deposition (PECVD), atomic layer deposition (ALD), plasma enhanced atomic layer deposition (PEALD), ion implantation, and resist removal. Semiconductor substrate processing apparatuses include gas delivery systems through which process gases are flowed and subsequently delivered into a processing region of a vacuum chamber of the semiconductor processing apparatus by a gas distribution system such as a showerhead, gas injector, gas ring, or the like. For example, the gas delivery system may be configured to supply process gas to a gas injector positioned in the semiconductor processing chamber above a semiconductor substrate so as to distribute process gases over a surface of the semiconductor substrate being processed in the semiconductor processing chamber. Current gas delivery systems are constructed from many individual components, many of which have conduits therein through which process gas flows.

Conventional semiconductor processing systems typically utilize gas sticks. The term "gas sticks" refers, for example, to a series of gas distribution and control components such as a mass flow controller (MFC), one or more pressure transducers and/or regulators, a heater, one or more filters or purifiers, and shutoff valves. The components used in a given gas stick and their particular arrangement may vary depending upon their design and application. In a typical semiconductor processing arrangement, over seventeen gas sticks may be connected to the semiconductor processing chamber via gas supply lines, gas distribution components, and mixing manifolds. These are attached to a base plate forming a complete system known as a "gas panel" or "gas box" which serves as a mounting surface for the gas sticks and which does not play a role in the gas distribution.

In general, a gas stick includes multiple integrated surface mount components (e.g., valve, filter, etc.) that are connected to other gas control components through channels on a substrate assembly or base plate, upon which the gas control components are mounted. Each component of the gas stick is typically positioned above a manifold block in a linear arrangement. A plurality of manifold blocks form a modular substrate, a layer of manifold blocks that creates the flow path of gases through the gas stick. The modular aspect of conventional gas sticks allow for reconfiguration, much like children's LEGO® block toys. However, each component of a gas stick typically includes highly machined parts, making each component relatively expensive to manufacture and replace. Each gas flow component is typically constructed with a mounting block, which in turn is made with multiple machine operations, making the component expensive.

SUMMARY

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale unless specifically indicated as being scaled drawings.

Disclosed herein is a gas delivery substrate for mounting the gas supply components of a gas delivery system gas box for a semiconductor processing apparatus. The substrate may include a plurality of layers having major surfaces thereof bonded together to form a laminate. The laminate may include openings configured to receive and mount at least a first gas supply component, a second gas supply component, a third gas supply component, and a fourth gas supply component on an outer major surface of at least one of the layers. The substrate may also include a first gas channel extending at least partially across an interior major surface of one of the layers and a second gas channel extending at least partially across a different interior major surface of one of the layers. The first gas channel may at least partially overlap the second gas channel when viewed from a direction perpendicular to the major surfaces of the layers. In addition, the substrate may include a first gas conduit that may include the first gas channel and which may be configured to connect the first gas supply component to the second gas supply component, and a second gas conduit including the second channel configured to connect the third gas supply component to the forth gas supply component.

Also disclosed herein is a system for a semiconductor manufacturing system gas box that includes the gas delivery substrate. The system includes gas supply components mounted on at least one major surface of the gas delivery substrate. In one implementation, the gas supply components may be mounted on opposing major surfaces of the gas delivery substrate. In another implementation, the system may include an on/off gas valve connected to an MFC through a gas conduit within the substrate, another on/off gas valve connected to a mixing manifold or chamber through a gas conduit within the substrate, and a mixing manifold or mixing chamber exit connected to one or more openings of the gas delivery substrate.

Disclosed herein is also a method of producing a gas delivery substrate. The method may include creating a first gas channel extending at least partially across an interior major surface of at least one layer of a plurality of layers having major surfaces thereof, creating a second gas channel extending at least partially across a different interior major surface, and creating openings on an outer major surface. At least some of the openings may be mounting holes configured to receive and mount at least a first gas supply component, a second gas supply component, a third gas supply component, and a fourth gas supply component. The method may further include bonding the layers together to form a laminate such that the first gas channel is at least partially overlapping the second gas channel, the first gas channel forms part of a first gas conduit connecting the first gas supply component to the second gas supply component, and the second gas channel forms part of a second gas conduit connecting the third gas supply component to the fourth gas supply component.

Also disclosed herein is a method of delivering gas through such a gas delivery substrate when the gases are supplied through the openings of the gas delivery substrate. The method may include delivering a first gas from the first gas supply component to the second gas supply component through the first gas channel, and delivering the first gas from the second gas supply component to a mixing chamber within the substrate through a third gas channel in the substrate. The method may further include delivering a second gas from the third gas supply component to the fourth gas supply component through the second gas channel, and delivering the second gas from the fourth gas supply component to the mixing manifold or chamber within the substrate through a fourth gas channel in the substrate. The method may also include mixing the first gas and the second gas in the mixing chamber to create a first gas mixture and delivering the first gas mixture through one or more gas channels in the substrate and/or one or more outlets on the substrate to a semiconductor processing chamber downstream.

In some implementations, a method may be provided that includes obtaining a ceramic substrate having a first side and second side opposite the first side. The ceramic substrate may include a surface-mount valve interface that is located on the first side; the surface-mount valve interface may include two or more holes in the ceramic substrate. The method may further comprise lapping or polishing at least one surface of the ceramic substrate surrounding the two or more holes such that the surface roughness of the at least one surface is less than or equal to 5 µin Ra.

In some implementations of the method, the method may further include positioning a crushable metal seal around at least one of the two or more holes, positioning a surface-mount gas flow component such that the at least one of the two or more holes aligns with a gas flow port on the surface-mount gas flow component and the crushable metal seal, and clamping the surface-mount gas flow component to the ceramic substrate using one or more fasteners, thereby compressing the crushable metal seal against the surface or surfaces having the surface roughness that is less than or equal to 5 µin Ra.

In some such implementations, the crushable metal seal may be a C-seal, a W-seal, or a metal o-ring. In some implementations of the method, the at least one of the two or more holes is counterbored such that the crushable metal seal is at least partially recessed within the counterbore of the hole when installed, and the at least one surface that is lapped or polished includes the floor of the counterbore. In some implementations of the method, the at least one surface may include the entire first side.

In some implementations, an apparatus may be provided that includes a ceramic substrate. The ceramic substrate may have a first side and second side opposite the first side, and may include a surface-mount valve interface that is located on the first side. The surface-mount valve interface may include two or more holes in the ceramic substrate, and the surface or surfaces surrounding the holes may have a surface roughness less than or equal to 5 µin Ra.

In some implementations, the apparatus may further include a crushable metal seal and a surface-mount gas flow component with one or more gas flow ports. The surface-mount gas flow component may be mounted to the ceramic substrate such that each gas flow port aligns with one of the holes, the crushable metal seal is interposed between the surface-mount gas flow component and the ceramic substrate, and the crushable metal seal is in contact with one of the surfaces having the surface roughness less than or equal to 5 µin Ra.

In some such implementations, the crushable metal seal may be a C-seal, a W-seal, or a metal o-ring. In some implementations of the apparatus, the ceramic substrate may further include at least one counterbore feature, and the at least one counterbore feature may correspond in location to one of the two or more holes and have a floor that intersects with the hole. In such implementations, the at least one surface that is lapped or polished to a surface roughness of less than or equal to 5 µin Ra may include the floor. In some implementations of the apparatus, the at least one surface may include the entire first side.

In some implementations, a method is provided. The method may include manufacturing a ceramic substrate having a first side and second side opposite the first side and including a plurality of surface-mount valve interfaces located on one or both of the first side and the second side, one or more channels located between the first side and the second side, and a plurality of drop-holes fluidically connecting the one or more channels with the surface-mount valve interfaces. The method may further include forming a coating on at least surfaces of the channels within the ceramic substrate.

In some implementations of the method, the manufacturing the ceramic substrate may include manufacturing a plurality of ceramic layers, laser-cutting the one or more channels into one or more of the layers, bonding the plurality of ceramic layers together, and sintering the bonded layers to form the ceramic substrate.

In some implementations of the method, the coating may have a thickness greater than or equal to the smallest nominal particle size of ceramic particles used to make the ceramic substrate or the maximum surface roughness exhibited by the surfaces of the one or more channels.

In some implementations of the method, the method may further include applying a glaze to surfaces of the channels, firing the ceramic substrate in a kiln or oven to melt the glaze, and cooling the ceramic substrate to solidify the molten glaze and form the coating.

In some implementations of the method, the method may further include inserting the ceramic substrate into a chemical vapor deposition (CVD) chamber and performing one or more CVD operations on the ceramic substrate to form the coating.

In some implementations of the method, the method may include masking, prior to performing the one or more CVD operations, portions of the first side or the second side to prevent the coating from being deposited on the masked portions.

In some implementations of the method, the method may further include inserting the ceramic substrate into an atomic layer deposition (ALD) chamber and performing a plurality of ALD operations on the ceramic substrate to form the coating.

In some implementations, an apparatus may be provided. The apparatus may include a ceramic substrate having a first side and second side opposite the first side, a plurality of surface-mount valve interfaces located on one or both of the first side and the second side, one or more channels located between the first side and the second side, a plurality of drop-holes fluidically connecting the one or more channels with the surface-mount valve interfaces, and a coating on at least surfaces of the one or more channels within the ceramic substrate.

In some implementations of the apparatus, the ceramic substrate may include a plurality of ceramic layers that are sintered together, and the one or more channels may have sidewalls that are laser-cut into one or more of the layers.

In some implementations of the apparatus, the coating may have a thickness greater than or equal to the smallest nominal particle size of ceramic particles used to make the ceramic substrate or the maximum surface roughness exhibited by the surfaces of the one or more channels sidewalls.

In some implementations of the apparatus, the coating may be a silica-containing glaze. In some other implementations of the apparatus, the coating may be a chemical vapor deposition (CVD) coating. In some such implementations of the apparatus, the CVD coating may be a polymeric coating. In some other implementations of the apparatus, the coating may be a conformal atomic layer deposition (ALD) coating.

These and other implementations are described in further detail with reference to the Figures and the detailed description below.

BRIEF DESCRIPTION OF THE DRAWING FIGURES

FIGS. 4-6 illustrate various views of a modular gas stick.

FIGS. 4-17 are drawn to-scale within each Figure, although the scale may vary from Figure to Figure.

DETAILED DESCRIPTION

Figure 1:
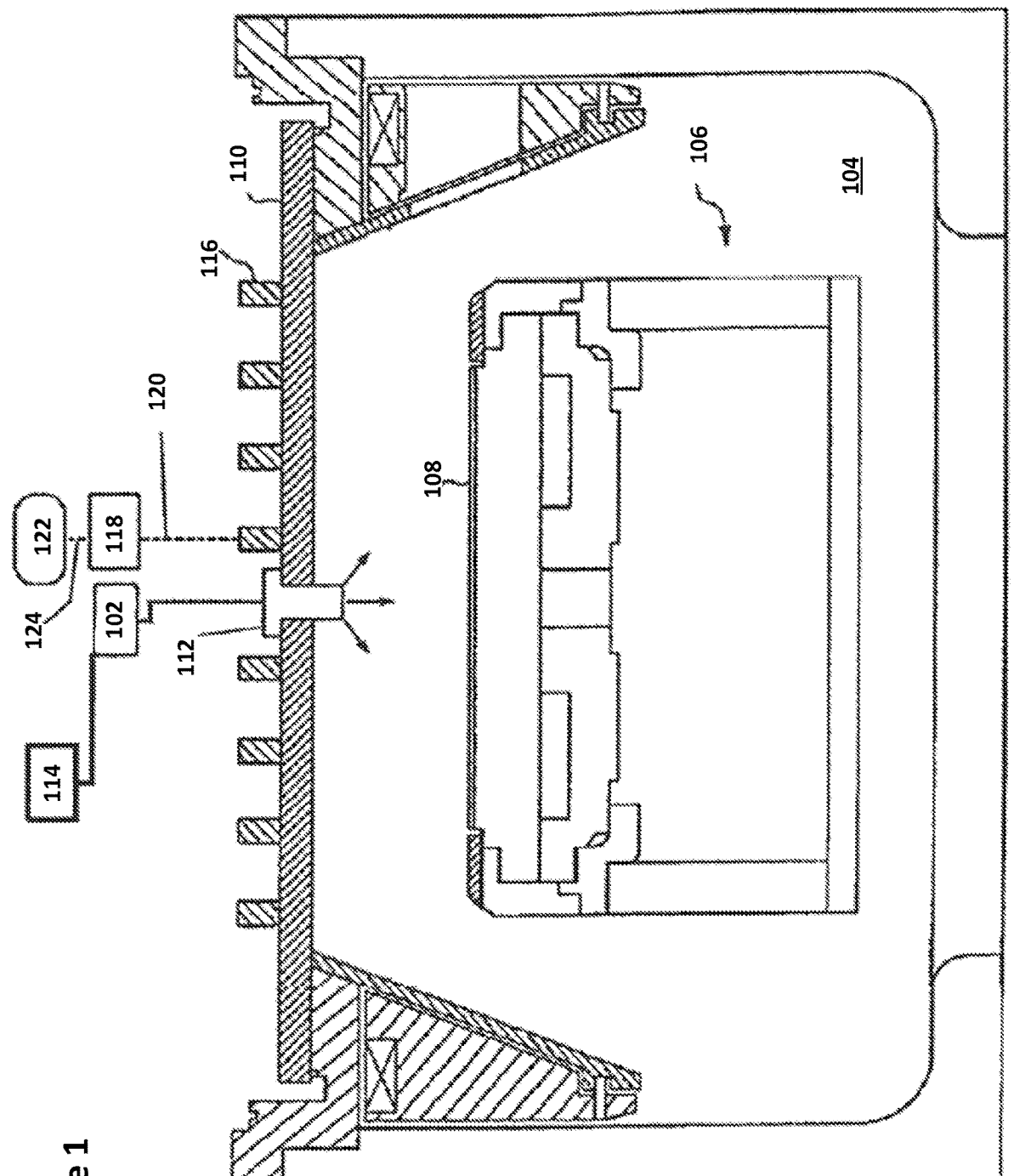
FIG. 1 illustrates an example implementation of a semiconductor substrate processing apparatus in accordance with implementations disclosed herein.

Disclosed herein is a gas delivery substrate for mounting gas supply components, also referred to herein as gas flow components, of a gas delivery system for a semiconductor processing apparatus and methods for producing and using the same. The semiconductor substrate processing apparatus may be used for processing semiconductor substrates by techniques including, but not limited to, plasma etching, physical vapor deposition (PVD), chemical vapor deposition (CVD), plasma enhanced chemical vapor deposition (PECVD), atomic layer deposition (ALD), plasma enhanced atomic layer deposition (PEALD), ion implantation, or resist removal. In the following description, numerous specific details are set forth in order to provide a thorough understanding of the present implementations. It will be apparent, however, to one skilled in the art that the present implementations may be practiced without some or all of these specific details. In other instances, well known process operations have not been described in detail in order not to unnecessarily obscure present implementations disclosed herein.

As integrated circuit devices continue to shrink in both their physical size and their operating voltages, their associated manufacturing yields become more susceptible to contamination. Consequently, fabricating integrated circuit devices having smaller physical sizes requires that the level of contamination be less than previously considered to be acceptable. In addition, the wafers and processing equipment used in semiconductor processing are becoming more complex and larger in size, in order to produce more dies per wafer. Accordingly, producing and maintaining the equipment and manufacturing the wafers is becoming more expensive.

Gas distribution systems of semiconductor substrate processing apparatuses may utilize gas sticks, each of which may be a series of gas distribution and control components such as, for example, a mass flow controller (MFC), one or more pressure transducers and/or regulators, one or more heaters, one or more filters or purifiers, manifolds, gas flow adaptors, and/or shutoff valves. The components used and their particular arrangement in a gas stick may vary depending upon their design and application. The number of gas sticks used in a particular gas distribution system may vary depending on the needs of the semiconductor process performed. For example, in some semiconductor substrate processing arrangements, over seventeen process gases, each supplied by a different gas stick, may be supplied to the chamber. Such gas distribution system components are typically attached to a base plate, typically called a "gas pallet," to form the system which is commonly known as a "gas panel" or "gas box."

As discussed above, gas delivery system components are traditionally made from metals such as stainless steel or other metal alloys and then assembled together, requiring interfaces and seals between the constituent components, in order to achieve desired conduit paths for process gases. However, the constituent components typically include precision-machined parts, making each component relatively expensive to manufacture, maintain, and replace. Each component is typically attached to a mounting block or base, which, in turn, is also precision-machined, making the component expensive. There may, for example, be three separate seal interfaces that require precision machining in a simple on/off valve—one that joins the valve assembly to its mounting block or base, one that joins the mounting block or base to a modular substrate module, and one or two that join the modular substrate module to other modular substrate modules forming a gas stick. Such interchangeable components require a substantial amount of space, which lengthens the fluidic connections that connect the components with each other. Thus, gas sticks made using the conventional interchangeable component approach have multiple potential failure points (in the form of multiple seals), include multiple contamination points (each seal interface represents a contamination point), and introduce gas delivery delays (due to their length).

Corrosion, erosion, and/or corrosion/erosion in environments, such as those formed in the interior of gas delivery systems may contain oxygen, halogens, carbonyls, reducing agents, etching gases, depositing gases, hydro-fluorocarbon process gas, and/or process gases which may be used in semiconductor substrate processing such as but not limited $Cl_2$, HCl, $BCl_3$, $Br_2$, HBr, $O_2$, $SO_2$, $CF_4$, $CH_2F_2$, $NF_3$, $CH_3F$, $CHF_3$, $SF_6$, CO, COS, $SiH_4$, and $H_2$. In addition inert gases, such as but not limited Ar and $N_2$, may be supplied to said environments.

Accordingly, disclosed herein is a gas delivery substrate for mounting gas supply components for multiple gas feeds of a gas delivery system for a semiconductor processing apparatus and methods for producing and using the same. The substrate may be formed from laminated layers which are bonded together to create a uniform monolithic structure having gas-tight channels that may be in fluidic communication with each other. These layers may be made from a variety of materials, including, for example, stainless steels, glass, or ceramics. In implementations using metal layers, the layers may be brazed together or otherwise bonded together. In implementations using ceramic layers, the layers may be bonded together before sintering and then sintered into a fused layer stack; the bonding material is typically burned off during the sintering process, resulting in a generally homogenous ceramic part.

The substrate may be configured to receive and mount gas supply components such that the gas supply components are in fluidic communication with each other via channels within the substrate. The layered structure of the substrate may allow channels or connections to be created of any size and in any direction in the X/Y planes of multiple layers, each of which may be connected to other channels or ports in other layers by connections in the Z direction within the substrate. For the purposes of this disclosure, the X and Y directions are defined as being parallel to the major surfaces of each layer, and the Z direction is defined as being perpendicular to each layer. The networks of channels within the layers may allow for complex, non-linear fluid routing arrangements that are not possible using conventional modular substrates. It is to be understood that, as used herein, the phrase "linear fluid routing" refers to fluid routing in which the fluid flow components in a fluid flow path are arranged in a line and the fluidic connections between such fluid flow components in planes parallel to the surfaces on which such fluid flow components mount generally travel in one direction or in parallel directions. In contrast, "non-linear fluid routing" refers to fluid routing in which the fluid flow components in a fluid flow path are not all arranged in a line and in which at least one fluidic connection between such fluid flow components follows a path having at least one non-orthogonal angle in it. In certain implementations, non-linear fluid routing may be used in which at least a portion of the fluidic connection between such fluid flow components follows a curvilinear path, i.e., at least a portion of the path is not a line, but a curve, arc, or spline; such further examples of non-linear fluid routing may be referred to as "curvilinear fluid routing." Existing gas box designs typically feature collections of fluid flow components that are arranged to provide fluid flow networks having linear fluid routing, e.g., 16 gas sticks having linear fluid routing may be arranged to join with line of T-junctions that have a linear fluid routing direction that is at 90° to the linear fluid routing directions of the gas sticks—at the gas stick level, the flow paths are all linear in nature.

Due to the flexibility in X, Y, and Z routing that is afforded in the layered or laminated substrate, non-linear fluid routing may be used, which allows for non-linear fluid flow component layouts. Moreover, due to the fact that the layered substrate approach allows for channels to cross over one another, it is possible to locate fluid flow components from a particular gas flow path on either side of another gas flow path, which provides further flexibility in mounting locations.

In this way, gas supply components of a gas delivery system may be housed closer together and various critical connections between components may be made shorter, which reduces the overall size of the gas delivery system (or allows for a gas delivery system with increased capacity to be housed in the same form factor as a smaller capacity traditionally-designed gas box) and reduces gas flow transit time between gas supply components. In addition, gas supply components and their connections are often made from high quality materials, such as expensive metal alloys, e.g., Hastelloy®, glass or ceramics—this dramatically increases the costs of certain components, e.g., modular substrate components—use of a layered substrate, as disclosed herein, may allow for a large number of expensive parts, such as the modular substrate pieces, tubing, fittings, etc., to be replaced by one, larger part. This larger part, while more expensive than any of the piece parts that it may replace, may nonetheless offer significant savings over all of the piece parts that it may replace. Moreover, by using a layered substrate, the assembly time needed to assemble the various piece parts that the layered substrate may replace may be eliminated, resulting in further savings. Use of a layered substrate also allows all of the seals between various piece parts, e.g., between modular substrate pieces, to be eliminated, which reduces the amount of leak testing that must be done, thereby further reducing the costs of such systems.

If a ceramic substrate is used, all of the metallic surfaces which typically contact process gases, i.e., become chemically wetted, within a typical modular substrate may be eliminated or reduced so as to comply with on wafer, i.e., substrate, purity requirements. The compact design of the layered substrate (as compared with the traditional gas-stick approach) allows for reduced material costs, a reduction of the number of possible contamination and failure points, and faster gas delivery pulsing and switching times for a gas delivery system by virtue of allowing for shorter gas flow paths between certain critical flow components.

FIG. 1 illustrates an implementation of a semiconductor substrate processing apparatus 104, e.g., an inductively coupled plasma processing apparatus, which may include a gas delivery system 102 including a gas delivery substrate for mounting gas supply components, as disclosed herein. As shown in FIG. 1, the inductively coupled plasma processing apparatus may include a vacuum chamber 104, e.g., a plasma etch chamber. The vacuum chamber 104 may include a substrate support (lower electrode assembly) 106 for supporting a semiconductor substrate 108 in the interior of the vacuum chamber 104. A dielectric window 110 may form a top wall of the vacuum chamber 104. Process gases may be injected into the interior of the vacuum chamber 104 through a gas injector 112. The gas delivery system 102 may supply process gases to the interior of the vacuum chamber 104 through the gas injector 112. Parameters, e.g., temperature, flow rate, and chemical makeup, of the process gases supplied to the interior of the vacuum chamber by the gas delivery system may be controlled by a control system 114.

Once the process gases are introduced into the interior of vacuum chamber 104, they may be energized into a plasma state by an antenna 116 supplying RF energy into the interior of vacuum chamber 104. The antenna 116 may be a planar antenna powered by an RF power source 122 and RF impedance matching circuitry 118 to inductively couple RF energy into the vacuum chamber 104. However, in an alternate implementation, the antenna 116 may be an external or embedded antenna which is nonplanar. An electromagnetic field generated by the application of RF power to the antenna may energize the process gas in the interior of the vacuum chamber 104 to form high-density plasma, e.g., 109-1012 ions/cm3, above the substrate 108. During an etching process, the antenna 116, i.e., an RF coil, may perform a function analogous to that of a primary coil in a transformer, while the plasma generated in the vacuum chamber 104 performs a function analogous to that of a secondary coil in the transformer. The antenna 116 may be electrically connected to the RF impedance matching circuitry 118 by an electrical connector or lead 120 and the RF power source 122 may be electrically connected to the RF impedance matching circuitry 118 by an electrical connector 124.

Figure 2:
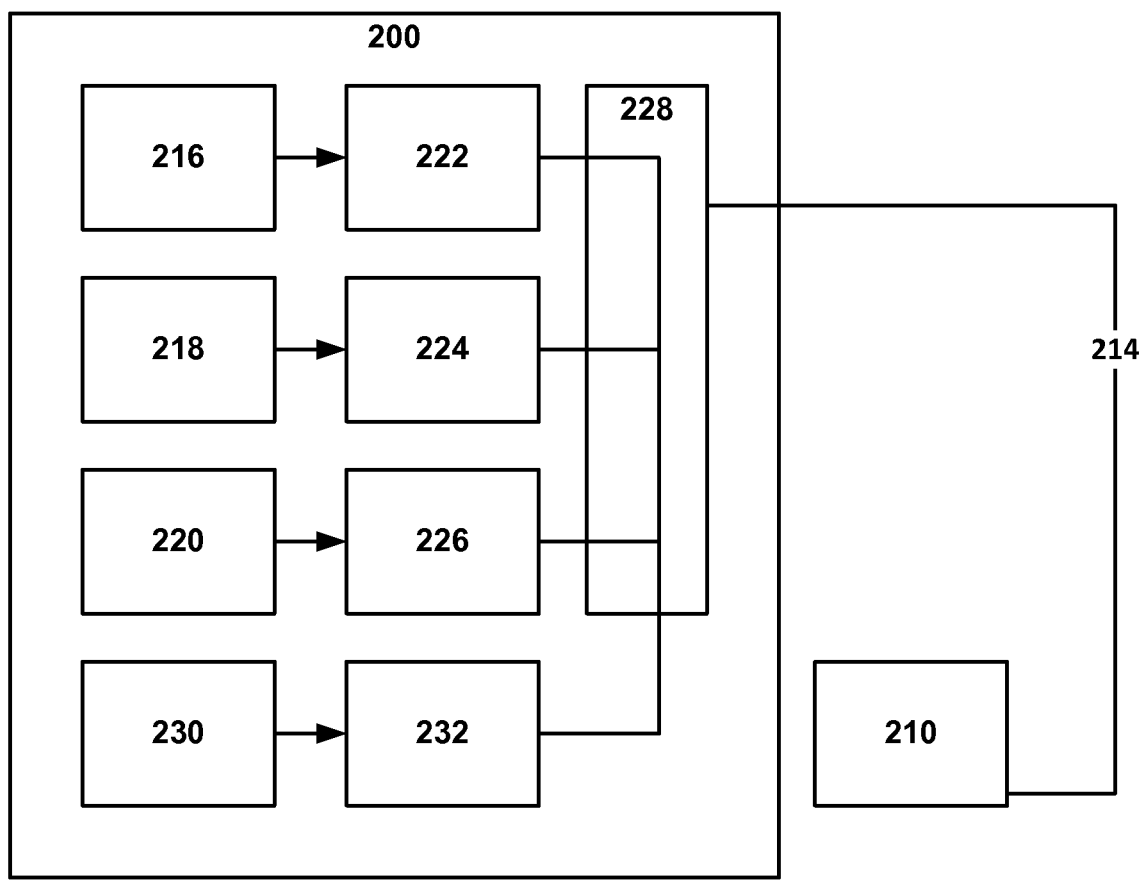
FIG. 2 is a schematic of an example gas delivery system in accordance with implementations disclosed herein.

FIG. 2 is a schematic view of an example gas delivery system 200 for a semiconductor substrate processing apparatus processing including a gas delivery substrate for mounting gas supply components, as disclosed herein. A vacuum chamber 210 of a semiconductor substrate processing apparatus may be supplied process gas through a gas supply line 214. The gas supply line 214 may provide process gases, such as etching and/or deposition gases, which may be alternatively supplied or pulsed, to a gas distribution member such as a showerhead or a gas injector arranged in the upper portion of the vacuum chamber 210, and downstream of the gas delivery system 200. Additionally, the gas supply line 214 may supply process gas to a lower portion of the vacuum chamber such as, for example, to a gas distribution ring surrounding the semiconductor substrate support or through gas outlets arranged in the substrate support (not shown). Processing gas may be supplied to gas line 214 from gas supplies 216, 218, 220, 230 with the process gases from supplies 216, 218, 220, 230 being supplied to MFCs 222, 224, 226, 232 respectively. The MFCs 222, 224, 226, 232 supply the process gases to a mixing manifold 228 after which the mixed gas is directed to gas flow line 214. Mixing manifold 228 may be within the substrate for mounting gas supply components or external to the substrate. The gas delivery system 200 includes a layered substrate for mounting gas supply components, as disclosed herein.

Figure 3:
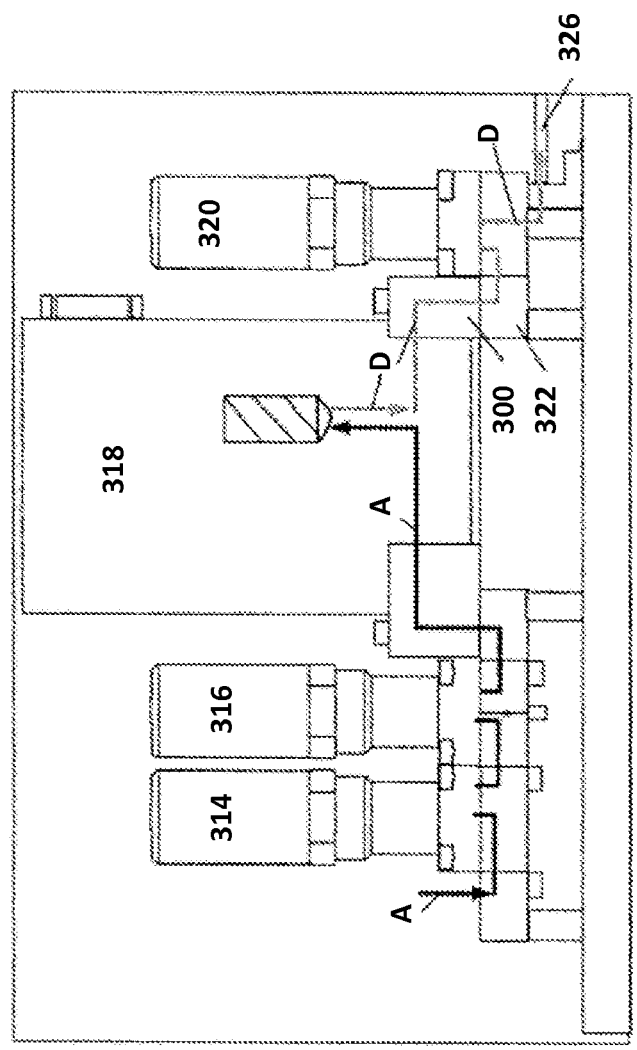
FIG. 3 illustrates an example of a gas stick.

FIG. 3 illustrates a cross section of a prior art gas stick with a modular substrate 322 and the flow of gases through such a gas stick. The gas may flow through a primary shut-off valve 314, out of a purge valve 316, and into an MFC 318 in the direction of flow path A. The gas may then flow out of the MFC 318 via an exit port 300 and into the modular substrate 322, through the mixing valve 320, out of an outlet 326, and into a mixing manifold or chamber (not shown), as illustrated by flow path D.

Substrate 322 is of a modular design which includes multiple interchangeable parts which are connected to each other with seals, which each introduce potential failure points in the gas stick assembly. Since substrate 322 is made up of multiple parts, it allows for a LEGO® type construction, which provides flexibility in how each gas stick is assembled. However, this design causes the flow path between gas supply components to become long, which increases fluid flow path lengths and thus transit time of gases, and introduces multiple failure points in the gas stick, as discussed above. In a conventional semiconductor processing gas box, the gas box includes discrete gas sticks, built up on discrete substrates such as the modular substrate 322, that are then mounted to a common mounting plate—the fluid flow passages in such conventional gas boxes are provided by the discrete substrates and are not included in the mounting plate.

FIGS. 4 through 6 show another example of a modular substrate gas stick. In FIG. 6, the individual piece-parts of the modular substrate are clearly shown in the exploded view. Each such modular piece-part 325 may interlock with the adjacent modular piece-part 325 and the two interlocked piece-parts 325 may then be bolted together. Once the assembled substrate is complete, then the gas flow components 323, which, in this example, are all valves of various types, may be assembled to the assembled substrate. Seals 327 may be interposed between the gas flow components 323 and the piece-parts 325 in order to provide a gas-tight seal interface. The gas flow path through such a modular gas stick assembly is represented by the flow arrows in FIG. 4; it is to be understood that the internal features of the valves in this example are not depicted, although such valves may be any of a variety of surface-mount valve technologies readily available in the industry.

Disclosed herein is a gas delivery substrate for mounting gas supply components of a gas delivery system that may be formed from stacked layers which are bonded together to create a uniform monolithic structure that is configured to receive and mount gas supply components such that the gas supply components are in fluidic communication with each other via channels within the substrate. The layered structure of the substrate may allow gas channels or conduits to be created of any size and in any of several directions. In some implementations, the layered substrate may also include channels or conduits for running electrical wire connections between gas supply components or may include electrical conductors that are embedded within the substrate for a similar purpose. In some alternative of further such implementations, the layered substrate may also include heater elements that are housed in one or more channels routed in a layer of the substrate, e.g., a layer of the layered substrate may have one or more meandering channels that each house a resistive heater element. In some alternative or further such implementations, the substrate may include channels or conduits for carrying pressurized air between gas supply components. For example, the channels or conduits within the substrate may provide pneumatic supply connections between a pneumatic manifold and diaphragm valves, e.g., on/off valves. For example, the diaphragm valves may include a solenoid which is actuated by pressurized air in order to control the flow of gas. Thus, gas supply components may be housed closer together on the substrate and the connections between components may be made shorter than the connections within substrate 322, as shown in FIG. 3.

Figure 8:
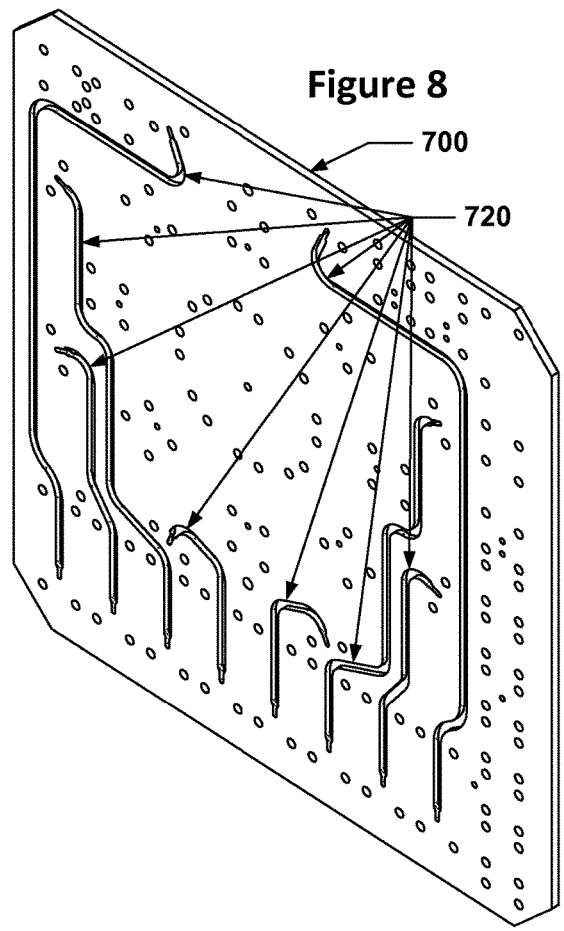
FIGS. 7 through 9 illustrate example implementations of single layers in a gas delivery substrate for mounting gas supply components of a gas delivery system for a semiconductor processing apparatus, in accordance with implementations disclosed herein.
Figure 7:
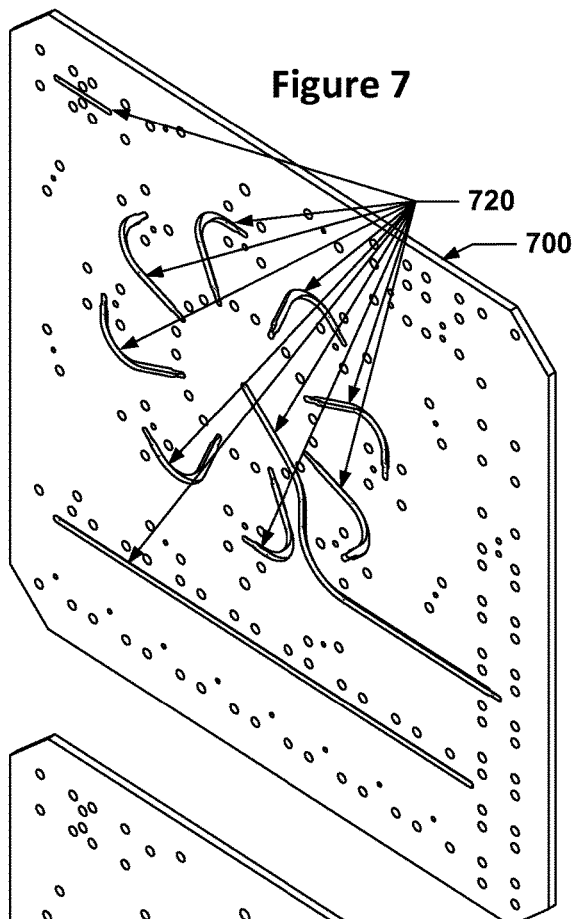
Figure 9:
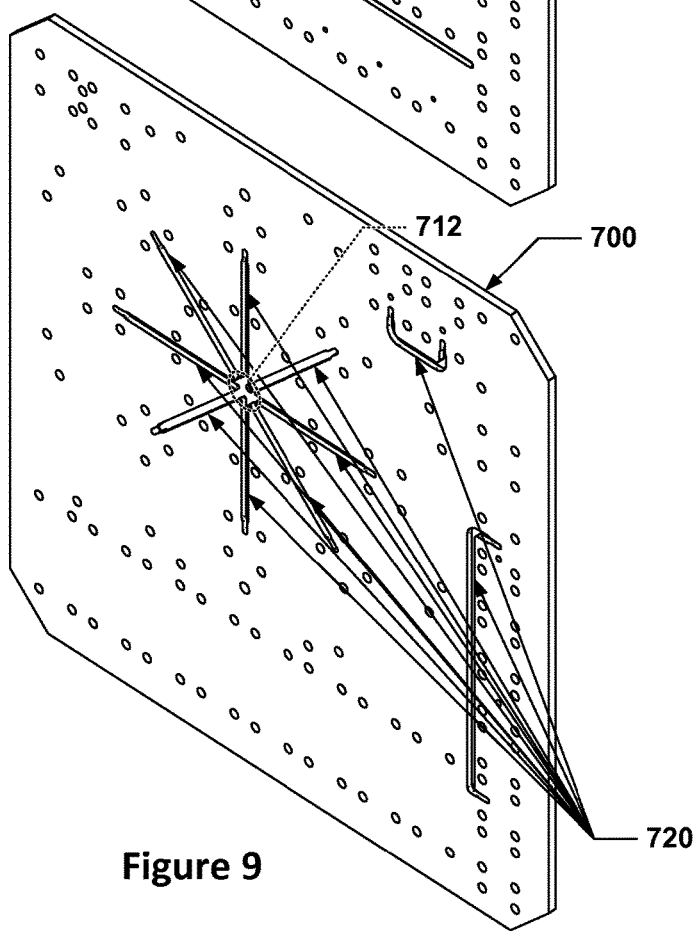

FIGS. 7-9 illustrate layers from an example of a layered gas delivery substrate for mounting gas supply components of a gas delivery system for a semiconductor processing apparatus, as disclosed herein. FIGS. 7-9 each show an example of a single layer which may be included in such a substrate; these layers may be stacked together (including with additional layers not pictured here) and then bonded together. The layers of the substrate may be made from any suitable material, such as ceramic, metal, metal alloy, glass, or composites. One or more layers of the substrate may also include one or more chambers or plenums, e.g., a mixing chamber. In some implementations, the substrate may include one or more chambers or plenums which extend through two or more layers of the substrate to form part of a mixing chamber. In some implementations, the substrate may have one or more flow restrictors, e.g., a filter or frit with one or more small openings, embedded within one or more of the layers, e.g., such as within a channel of a layer or housed within a through-hole of a layer. In addition, a flow splitter, e.g., a T-junction, +-junction, or other multi-path junction, may be created within one or more layers of the substrate for diverting gas.

As shown in FIGS. 7-9, a layer 700 may include multiple vertical through-holes 710 and horizontal channels or passages 720. Vertical through-holes 710 may be configured as gas conduits to provide fluidic communication between channels in different layers, between ports on opposing outer surfaces of the substrate, or between a port on an outer surface of the substrate and a channel or channels in one or more of the layers (vertical through-holes that connect an internal passage or channel of the substrate to an exterior surface of the substrate may also be referred to herein as "drop-holes"). Mounting holes 708 may provide through-holes through which threaded fasteners, e.g., screws or bolts, may be inserted in order to fasten or attach gas supply components to the substrate. The mounting holes 708 may also be blind holes with internal threads or threaded inserts. The vertical through-holes 710 used for gas conduits may be coated with one or more additional materials, such as metal, glass, plastic, ceramic, metal alloys, or composites. In FIGS. 7-9, the vertical through-holes 710 are the smaller-diameter holes, and the mounting holes 708 are the larger-diameter holes, as shown in the "Hole Size Guide" included with FIGS. 7-9.

It is to be understood that, vertical through-holes 710 may take any of a variety of shapes or follow any of a variety of directions, i.e., they are not necessarily constrained to be vertical (perpendicular to the substrate), but may also be slanted or have other geometries. In some cases, the vertical through-holes 710 of multiple layers may be configured so as to line up and create a gas-tight connection that spans multiple layers when the layers are bonded together. Additionally, some vertical through-holes 710 in a given layer may connect with a channels on the opposite side of the layer, or may connect two channels on opposing sides of the layer. The vertical through-holes 710 also may be non-cylindrical, e.g., they may be tapered, or may change size from one layer to another, e.g., for a series of three vertical through-holes 710 that align with one another in a layer stack, the middle vertical through-hole 710 may have a larger diameter, allowing a frit or other flow restriction device or filter device of that larger diameter to be inserted into the middle vertical through-hole 710, where it may be trapped in place by the smaller-diameter vertical through-holes 710 in the adjacent layers. In some implementations, vertical through-holes 710 may extend vertically or at an angle in any direction within the three dimensional space of a layer (e.g., X-direction, Y-direction, and Z-direction).

Also shown in FIG. 7, a layer of the gas delivery substrate may include horizontal channels 720, i.e., channels that traverse the layers in directions parallel to the plane of the major surface(s) of the layer. Horizontal channels 720 may be linear, follow curvilinear paths, or split into or join with multiple other horizontal channels. Horizontal channels 720 may extend partially into or completely through a layer. Also, horizontal channels 720 may vary in cross-section as they traverse a layer. For example, the horizontal channels 720 may have a depth that is deeper at one end and shallower at another end, potentially resulting in a decreasing or increasing cross-sectional area perpendicular to the direction of flow within such a channel. The slope of a channel may also be varied (e.g., zigzag, curving or undulating). In addition, horizontal channels 720 may be configured to create a gas-tight connection with vertical through-holes 710 and/or horizontal channels 720 of another layer when the layers are bonded together to form a gas conduit. Alternatively, vertical through-holes 710 may connect to horizontal channels 720 within the same layer, e.g., on opposite sides of the same layer, to form a gas conduit. Horizontal channels 720 may be set parallel to a plane of the layer or at any angle with respect to the plane of the layer. Interior surfaces of horizontal channels 720 and vertical through-holes 710 may be coated with corrosion resistant material, such as siloxane, see U.S. Patent Application Publication No. 2011/0259519, the disclosure of which is hereby incorporated by reference in its entirety, which discusses such treatments. In some cases, horizontal channels may partially or fully overlap, when viewed from a direction normal to the major surfaces of the layers, other horizontal channels in other layers or on an opposite side of the layer having such horizontal channels. Also, some horizontal channels may cross over other horizontal channels and/or some vertical channels. In this way, connections between gas supply components may be more efficiently routed, in order to save space and reduce the overall footprint of the substrate.

As discussed earlier, the horizontal channels 720 may follow any path, e.g., straight, rectilinear, meandering, winding, curved, or curvilinear, within a layer. For example, horizontal channels 720 may extend radially from a common point and then follow a curved path, e.g., to form a radial array of J-shaped paths.

One or more of the layers may also include a larger volume that may serve as a mixing chamber or manifold. For example, the center "hub" from which the eight spoke channels 720 radiate in the layer shown in FIG. 9, which is indicated with a dotted circle and the reference 712, may serve as a mixing chamber or manifold.

Figure 10:
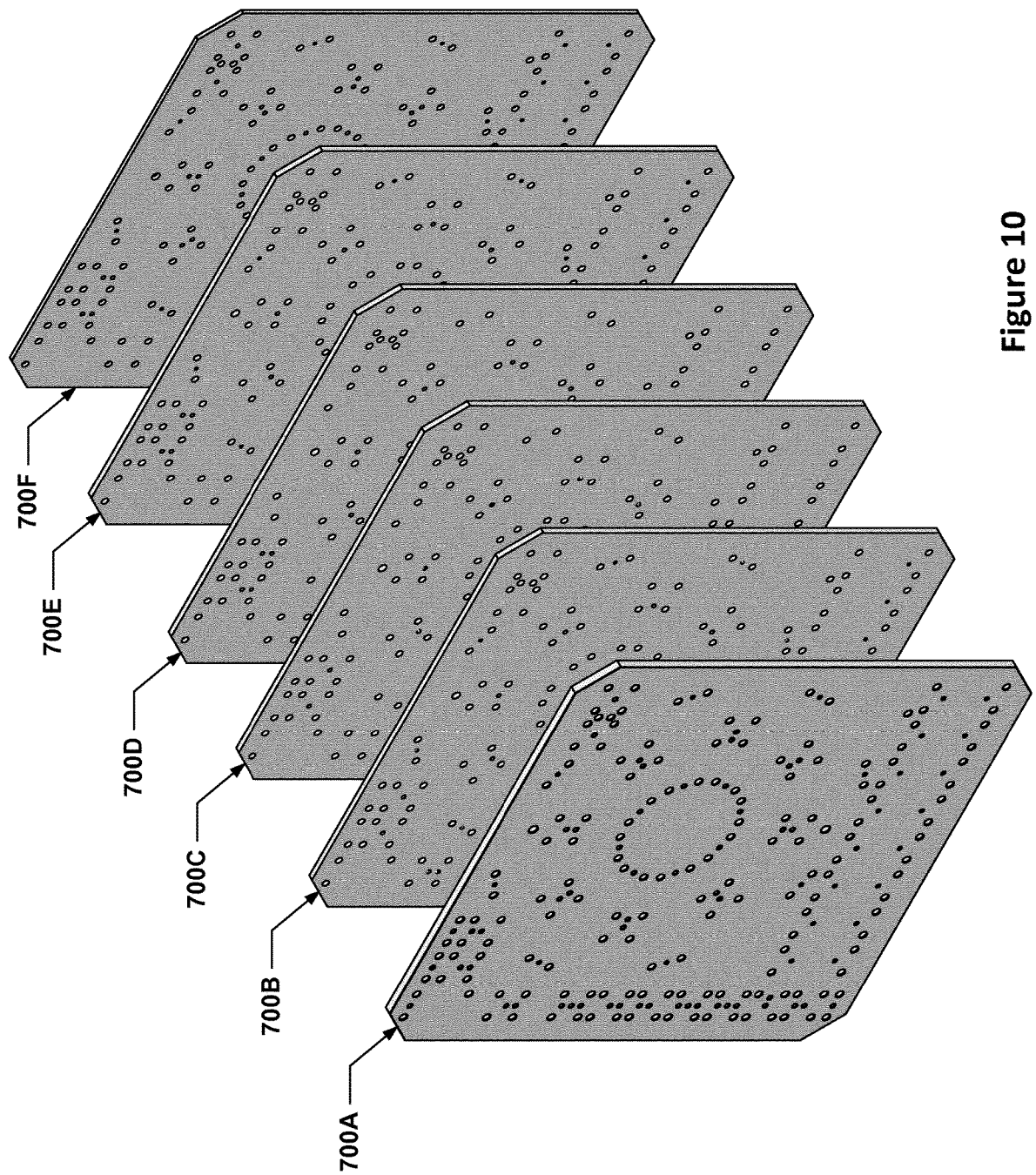
FIGS. 10 and 11 illustrate multiple example layers of an example gas delivery substrate for mounting gas supply components before being bonded together, in accordance with implementations disclosed herein.
Figure 11:
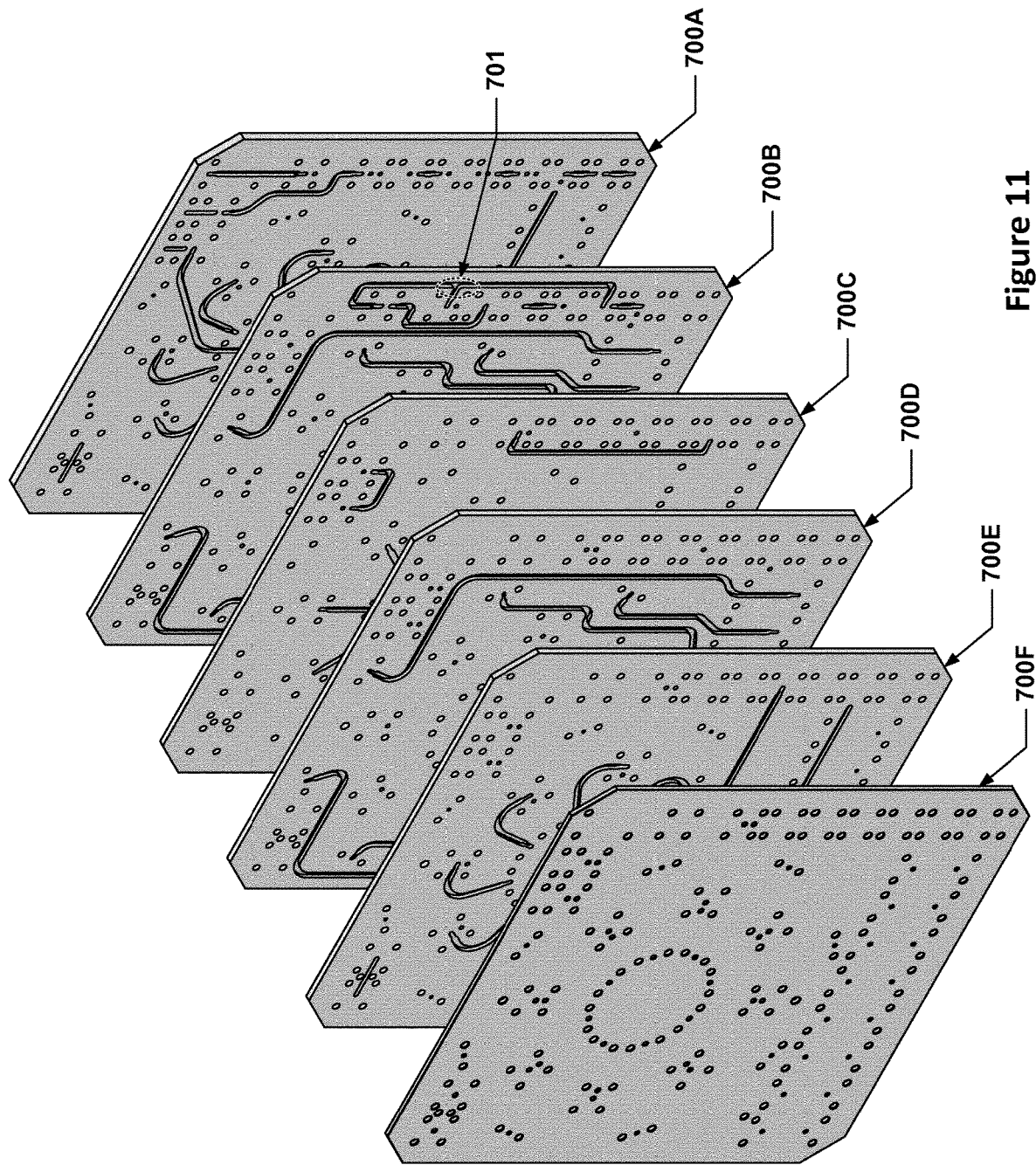

FIGS. 10 and 11 show an example of a gas delivery substrate for mounting gas supply components of a gas delivery system including multiple layers prior to those layers being bonded together. FIGS. 10 and 11 show different layers 700A-700F of a substrate 700; FIG. 10 shows an isometric exploded view from one side, and FIG. 11 shows an isometric exploded view from the other side. The channels 720 are, in this example, all located on the surfaces of the layers facing in the same direction, although in other implementations, some of the channels 720 may be located on surfaces of the layers facing in opposite directions from other surfaces of the layers having channels 720. Generally speaking, each vertical through-hole 710 and channel 720 in each layer may line up with a corresponding vertical through-hole 710 in at least one adjacent layer. As shown, the substrate 700 may include as many layers as are needed in order to achieve the desired routing paths for gas flow streams. For example, the substrate 700 in this example includes six layers 700A-700F, including outer layers 700A and 700F, and inner layers 700B-700E. Each layer of the substrate may have vertical through-holes and/or horizontal channels. Also, each layer may include one or more chambers or plenums, e.g., such as a mixing chamber 712, which may extend partially through a layer or completely through one or more layers. Depending on the materials used to make the layers of a layered substrate, the layers may be bonded together through firing, sintering, adhesive, friction welding, pressure (such as through hot isostatic pressing), welding, soldering, cold spraying, and heat treatment, ultrasonic welding, cooling, brazing, or diffusion bonding. By selecting a proper material for each layer and the bonding material, the substrate may have improved corrosion resistance and gas purity while also reducing cost by avoiding expensive metal alloys, e.g., Hastelloy®, or stainless steel, e.g., 316. Alternatively, the layers may be clamped together through any mechanical means, such as clamps, bolts, screws, rivets, or through-bolts.

Figure 12:
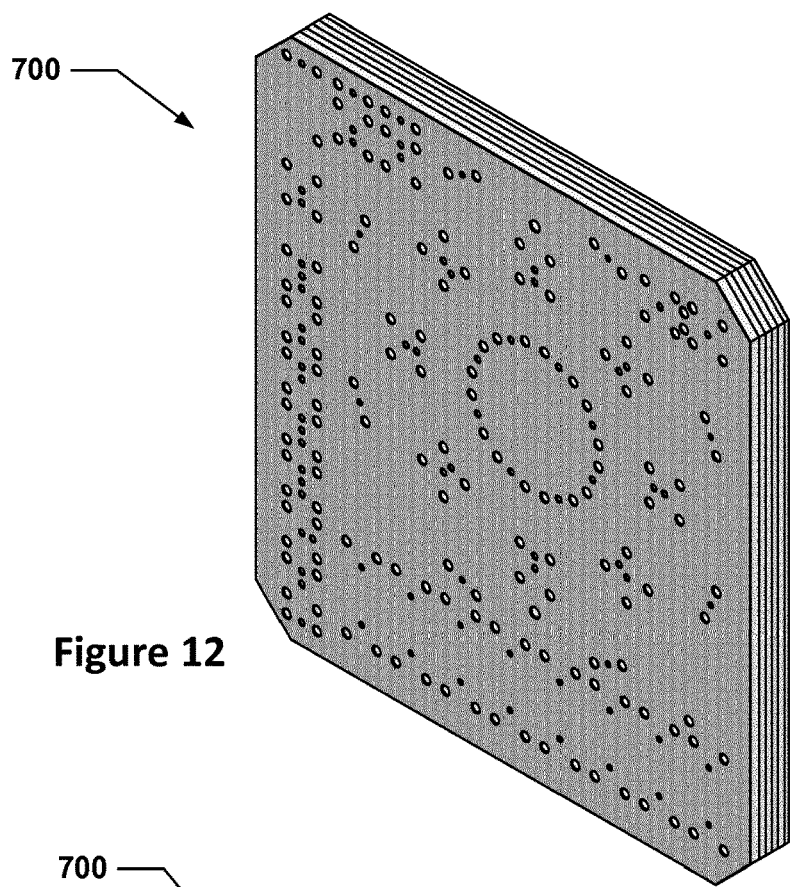
FIG. 12 illustrates multiple layers of an example gas delivery substrate for mounting gas supply components of a gas delivery system after being stacked together, in accordance with implementations disclosed herein.
Figure 13:
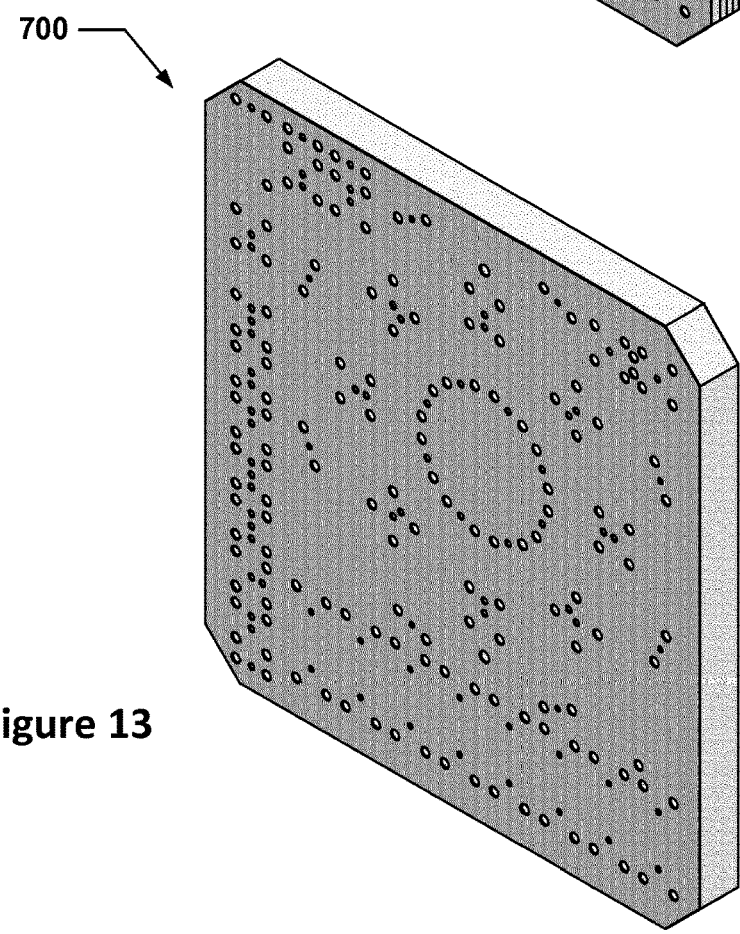
FIG. 13 illustrates multiple layers of the example gas delivery substrate of FIG. 12 after being stacked together and bonded, in accordance with implementations disclosed herein.

FIGS. 12 and 13 illustrate the gas delivery substrate layers of FIGS. 10 and 11 bonded together to form a monolithic substrate structure 700. The layers of the substrate 700 may be made of the same material such that, when bonded together, they form a uniform, monolithic structure (although if a material is used to facilitate the bonding, e.g., an adhesive or braze material, such material may differ from the layer material). Each layer of the substrate may have a uniform thickness or a non-uniform thickness. Alternatively, different materials may be used for each layer. For example, the outer layers may be formed from a higher quality material than the inner layers and vice versa. In addition, the layers may have identical overall shapes or different overall shapes or configurations. For example, two smaller-area layers may both be bonded to the same side of a common, larger layer. In another example, one layer may have a rectangular shape while another layer may have a circular shape.

As can be seen in FIGS. 12 and 13, once the layers are bonded together, the channels 720 within the substrate are sealed off, leaving the vertical through-holes 710 as the only fluidic connection between those channels 720 and the fluid flow components that may be mounted to the substrate 700 by way of the mounting holes 708.

The substrate may be formed such that it is configured to receive and mount gas supply components on the exposed out major surfaces of the topmost and/or bottommost layer of the substrate. In addition, the substrate may be formed with three sides or more sides (e.g., a triangular shape, a rectangle, pentagon, hexagon, etc.), such that the one or more sides of the substrate are configured to receive and mount gas supply components. Alternatively, the layered substrate may be formed in a circular, oval or curvy shape (e.g., a single vertical side). Also, the substrate may be formed with a mixture of flat angular sides and curved sides (e.g., a "D" shape). In addition, the substrate may be formed such that it is configured with one or more gas inlets and one or more gas outlets. The gas inlets and outlets may be included in any layer or across more than one layer of the substrate. The gas outlets may be configured to connect to one or more gas lines and/or a processing chamber downstream.

Figure 14:
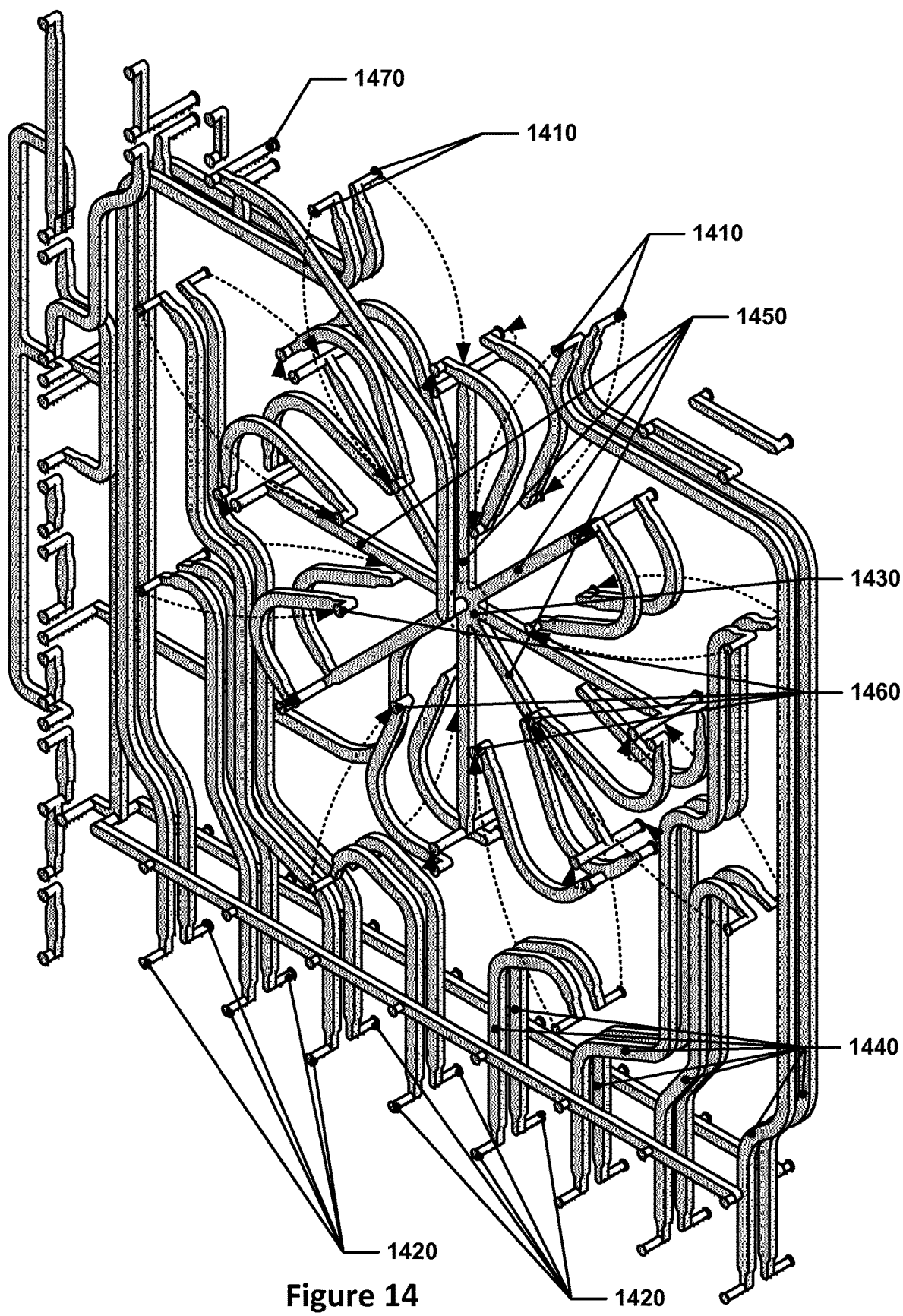
FIG. 14 depicts a three-dimensional rendering of the fluid flow conduits, e.g., channels and vertical through-holes, located within the example gas delivery substrate of FIGS. 10-13.

FIG. 14 depicts a three-dimensional rendering of the fluid flow conduits, e.g., channels and vertical through-holes, located within the substrate 700 of FIGS. 10-13. FIG. 14 does not show the substrate itself, nor show the mounting holes. FIG. 14 may be thought of as a depiction of the structure that would occur if a molten material were to be flowed through all of the flow conduits within the substrate and allowed to cool and harden into a solid, and the substrate then subsequently removed without damaging the cooled, solid material. As can be seen, the conduits are able to follow complicated paths that overlap one another, criss-cross or cross over one another, etc. Moreover, certain portions of these conduits may be identical for each individual gas flow path. For example, each of the eight, straight radial spoke channels that radiate outward from the mixing chamber near the center of the conduit network is the same length, and connects up with vertical through-holes that may connect up with a different pair on/off valves of sixteen on/off valves mounted on opposing sides of the substrate. These on/off valves may, in turn, each be connected, via another vertical through-hole, with one of the sixteen identical J-shaped channels that are arranged in a radial array around the mixing chamber. Each J-shaped channel may, in turn, be connected, via another vertical through-hole, with a different one of sixteen mass flow controllers that are mounted on opposing sides of the substrate. The J-shaped channels and straight radial spoke channels, and the vertical through-holes connecting them with the valves and mass flow controllers, may all be identical (or mirror images of one another) such that transit time and delivery delay of the gas that is metered out from the mass flow controllers is not dependent on the mounting locations of the mass flow controllers or the valves. Upstream of the mass flow controllers, however, the channels and vertical through-holes may differ in length and configuration/shape from flow path to flow path. Since these differences, if they exist, are upstream of the mass flow controllers, however, such differences would not cause differences in transit time or delivery delay of the gases into the mixing chamber. In FIG. 14, some of the connections between channels/vertical through-holes that are provided by valves or mass flow controllers are indicated by dotted lines (with arrows indicating direction of flow).

As can be seen in FIG. 14, a plurality of vertical through-holes may serve as gas inlets 1420; each gas inlet 1420 may have a manual shut-off valve connected to a process gas interfaced to it and may be fluidically connected to an upstream gas supply channel 1440, which, in turn, may be fluidically connected with another vertical through hole located at the opposite end of the channel 1440; this vertical through-hole may be connected to a mass flow controller, the exit of which may be fluidically connected with vertical through-holes 1460, which may be in fluidic communication with, as shown in the depicted example, the J-shaped passages. Each J-shaped passage may fluidically connect one of the vertical through-holes 1460 with another vertical through-hole that may be interfaced with a shut-off valve, which may then connect with one of the radial channels 1450 leading to a mixing chamber 1430; the mixing chamber 1430 may be fluidically connected by another channel to an outlet 1470.

In addition to housing conduits within the layers of the substrate, one or more layers of the substrate may include a gas flow splitter (see, for example, splitter 701 in FIG. 11), a heater, a restrictor (e.g., a filter with one or more small holes), and/or a gas mixing manifold. In an implementation, the layers of the substrate may include air conduits. For example, the air conduits may allow a pneumatic manifold to connect to and control diaphragm valves or air actuators mounted on the substrate.

Figure 15:
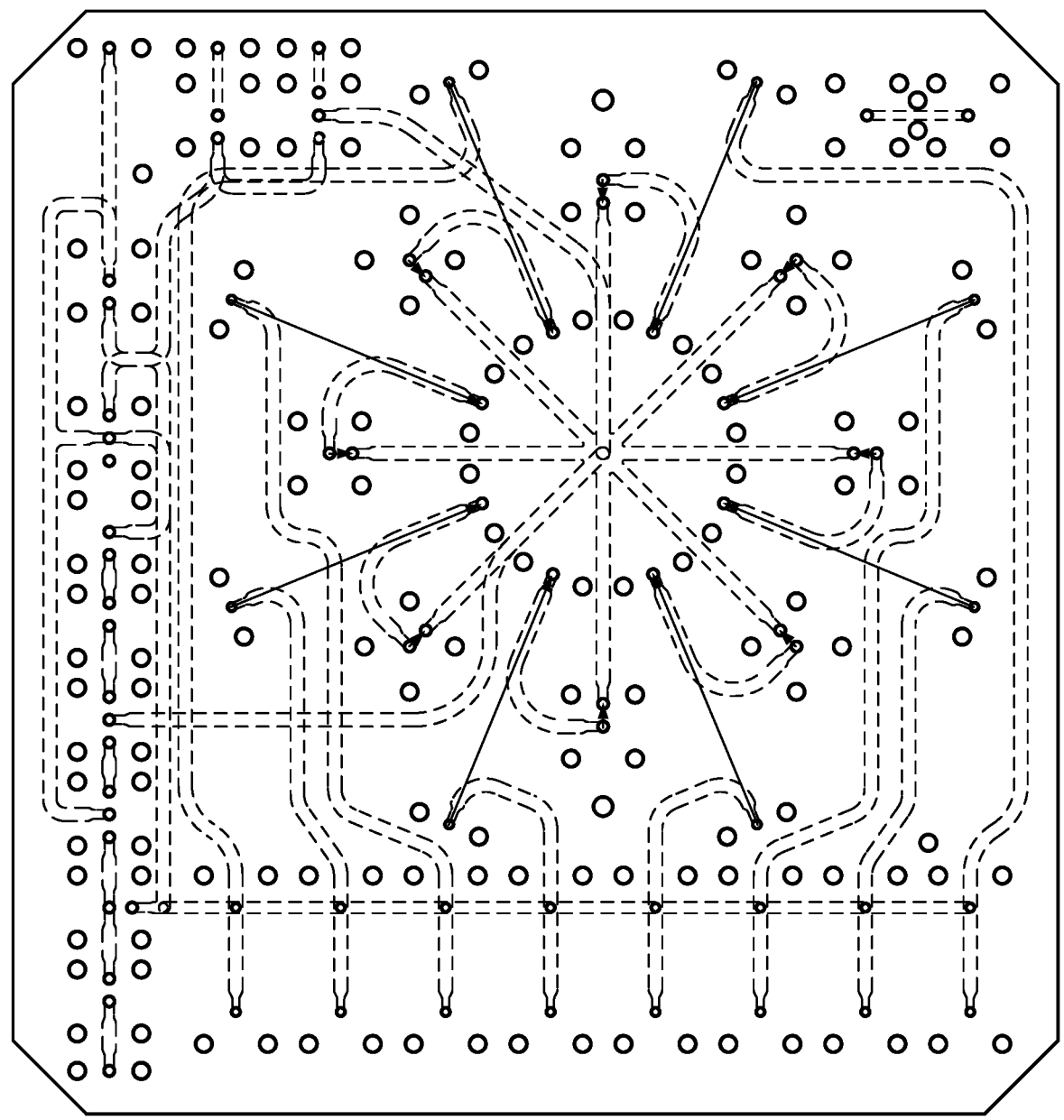
FIG. 15 depicts a plan view of the example gas delivery substrate of FIG. 12.

FIG. 15 depicts a plan view of the example gas delivery substrate of FIG. 12. As can be seen, the channels, shown in dashed lines, in the gas delivery substrate may pass over or under one another, follow common paths at different elevations at times, and otherwise achieve flow geometries that are difficult or impossible to achieve using conventional gas stick implementations.

Figure 16:
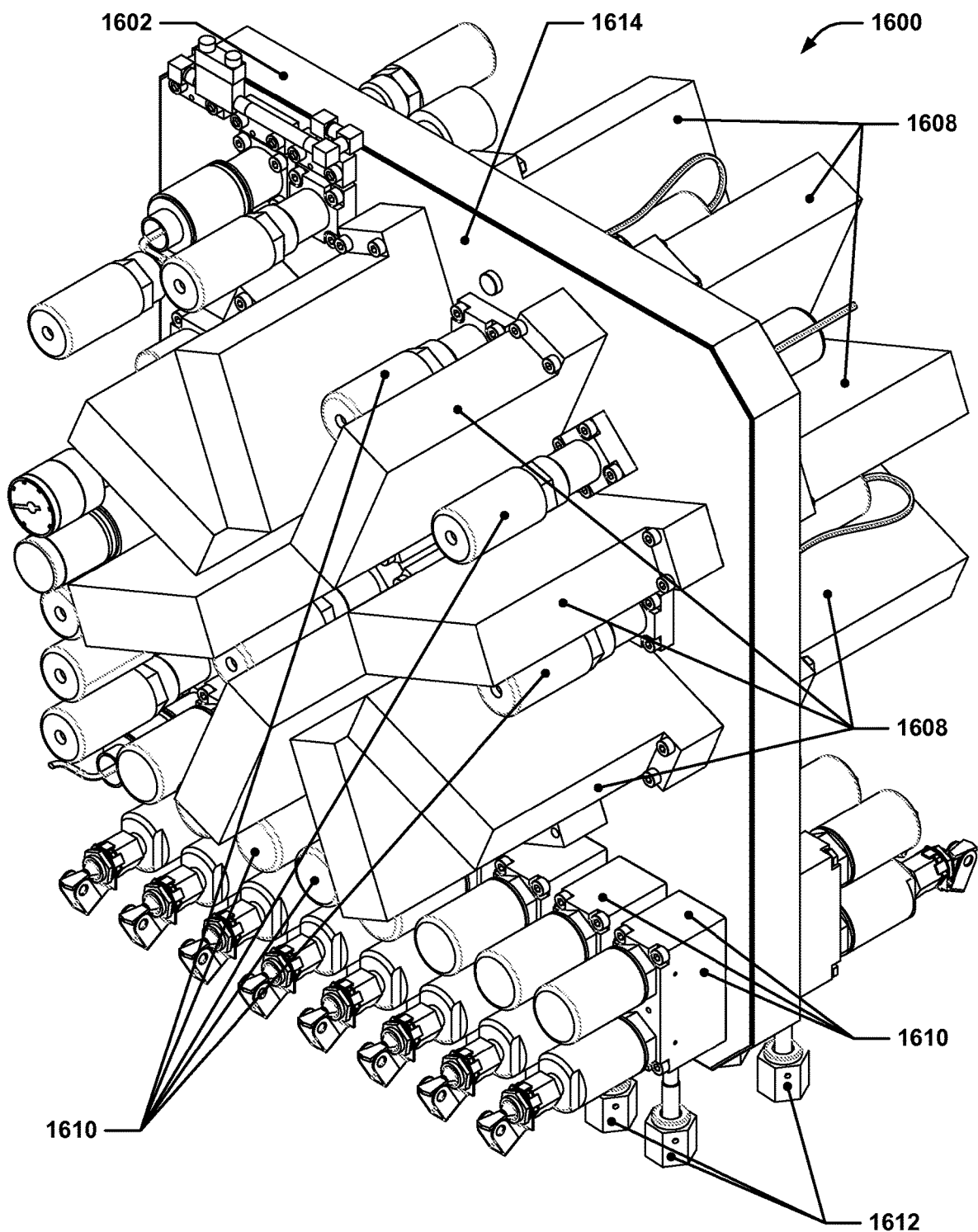
FIG. 16 depicts an isometric view of an example gas delivery system utilizing an example layered substrate.
Figure 17:
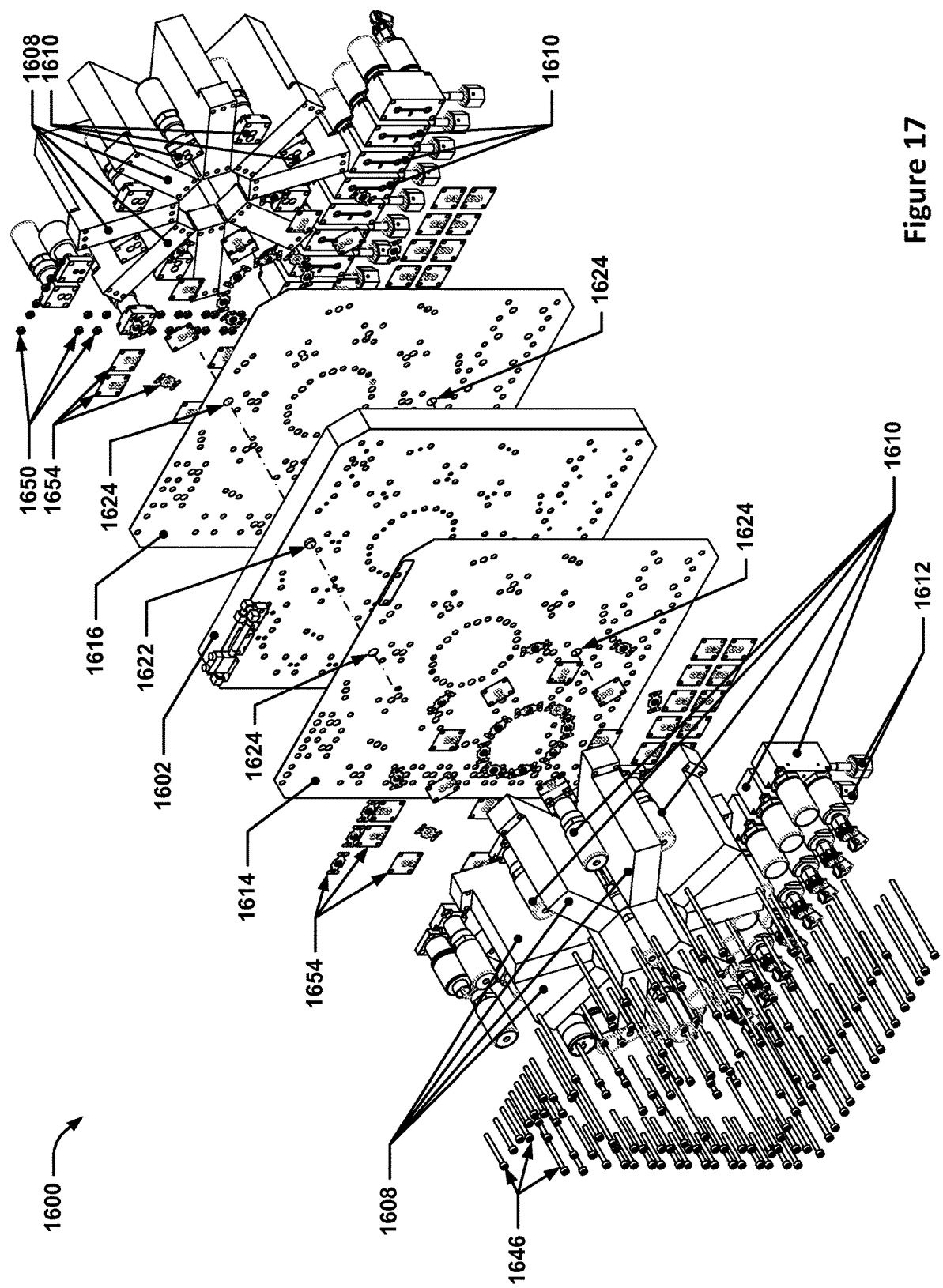
FIG. 17 depicts an isometric exploded view of the example gas delivery system of FIG. 16.

FIGS. 16 and 17 depict isometric views of an implementation of a gas delivery substrate as described herein with associated gas supply components of a gas delivery system for a semiconductor processing apparatus. FIG. 16 is an isometric view of a gas delivery substrate 1602 that forms a gas delivery system 1600, and FIG. 17 is an isometric exploded view of the substrate 1602. As discussed, the substrate may be configured to receive and mount a variety of different gas supply components; a seal 1654 may be sandwiched between each gas supply component and the ceramic substrate 1602 in order to provide a leak-tight seal. In the particular implementation shown, the locations of many of the gas supply components, e.g., valves 1610 and MFCs 1608, on both sides of the substrate match up so that a single set of fasteners 1646 (bolts) and 1650 (nuts) may be used to mount two opposing gas supply components to the substrate—this may be more clearly evident in the exploded view of FIG. 17. It is to be understood that a variety of different types surface-mount gas supply or gas flow components (such as the valves 1610 and MFCs 1608) may be mounted to the gas delivery substrate, including, but not limited to, vacuum coupling radiation (VCR) fittings, electronically operated gas valves, pneumatically-operated gas valves, manually-operated gas valves, gas pressure regulators, gas filters, purge gas supply components, gas flow restrictors, and/or pressure transducers. The gas delivery substrate 1602 may receive process gases via a plurality of gas inlets 1612. For example, the gas supply components may be organized in different sections on any side of the substrate. In addition, the substrate may be configured with one or more gas outlets or openings for allowing gas to exit the substrate. The outlets may be included on any side of the substrate. The gas outlets may be configured to connect to one or more gas lines and/or a processing chamber downstream.

The gas delivery substrate may be configured to receive and mount gas supply components such that different components may be shared between different gas lines. This design may save space and reduce costs while also reducing gas pulsing and switching times. In addition, FIGS. 16 and 17 illustrate an example of a substrate that is configured to receive and mount some gas supply components in a radial or circular array arrangement on the substrate. In other words, some of the gas supply components may be arranged in a ring formation around a common point, such as a mixing chamber within the substrate. For example, the substrate may include a multi-inlet mixing chamber, similar to the mixing chamber 712, where the gas inlets from the MFCs and/or the on/off valves interposed between the MFCs and the mixing chamber are spaced equally from the center mixing chamber. In such an arrangement, the length scales for all gas species approach zero, or are zero.

For example, a mixing manifold within the substrate may include a cylindrical or spherical mixing chamber defined by features within one or more layers of the substrate, and the gas inlets may be located at circumferentially spaced locations on any side of the substrate. By having all of the gas supply flow paths terminate in a radial spoke arrangement, as opposed to the traditional "comb" approach where individual gas sticks form the "tines" of the comb and the mixing chamber is formed by the "spine" of the comb, a spherical or cylindrical mixing chamber may be used. Moreover, the mixing chamber volume may be considerably smaller when compared to a mixing chamber that is fluidically connected with a large number, e.g., 16, gas sticks laid out side-by-side one another, as is traditionally done in gas boxes. Such a radial arrangement allows for both high flow and low flow gases to be mixed effectively instantly, and for co-flow effects, i.e., gas mixing delays due to gas position or location, to be virtually or completely eliminated.

In some implementations, a manual valve may be mounted on the gas delivery substrate for carrying out the supply or isolation of a particular gas supply. The manual valve may also have a lockout/tagout device above it. Worker safety regulations often mandate that plasma processing manufacturing equipment include accidental activation prevention capability, such as a lockout/tagout mechanism. A lockout generally refers, for example, to a device that uses positive means such as a lock, either key or combination type, to hold an energy-isolating device in a safe position. A tagout device generally refers, for example, to any prominent warning device, such as a tag and a means of attachment that may be securely fastened to an energy-isolating device in accordance with an established procedure.

A regulator may be mounted on the gas delivery substrate to regulate the gas pressure of the gas supply and a pressure gas may be used to monitor the pressure of the gas supply. In implementations, the pressure may be preset and need not be regulated. In other implementations, a pressure transducer having a display to display the pressure may be used. The pressure transducer may be positioned next to the regulator. A filter may be used to remove impurities in the supply gas. A primary shut-off valve may be used to prevent any corrosive supply gases from remaining in the substrate. The primary shut-off valve may be, for example, a two-port valve having an automatic pneumatically operated valve assembly that causes the valve to become deactivated (closed), which in turn effectively stops gas flow within the substrate. Once deactivated, a non-corrosive purge gas, such as nitrogen, may be used to purge one or more portions within the substrate. The purge gas component and the substrate may have, for example, three ports to provide for the purge process (i.e., an entrance port, an exit port, and a discharge port).

A mass flow controller (MFC) may be located adjacent the purge valve. The MFC accurately measures the flow rate of the supply gas. Positioning the purge valve next to the MFC allows a user to purge any corrosive supply gases in the MFC. A mixing valve next to the MFC may be used to control the amount of supply gas to be mixed with other supply cases on the substrate. In an implementation, a portion of the MFC may be built into one or more layers of the substrate. For example, a flow restrictor (e.g., a filter with one or more small holes) or a flow diverter may be built into one or more layers of the substrate.

In implementations, a discrete MFC may independently control each gas supply. Example gas component arrangements, and methods and apparatuses for gas delivery are described, for example, in U.S. Patent Application Publication No. 2010/0326554, U.S. Patent Application Publication No. 2011/0005601, U.S. Patent Application Publication No. 2013/0255781, U.S. Patent Application Publication No. 2013/0255782, U.S. Patent Application Publication No. 2013/0255883, U.S. Pat. Nos. 7,234,222, 8,340,827, and 8,521,461, each of which are commonly assigned, and the entire disclosures of which are hereby incorporated by reference herein in their entireties.

In other implementations, MFCs may be used to initiate the desired flow set point for each gas and then release the respective gases for immediate mixing in a mixing manifold or chamber within the gas delivery substrate. Individual gas flow measurement and control may be performed by each respective MFC. Alternatively, a single MFC controller may operate multiple gas lines.

In some implementations, the MFCs that are mounted to the substrate may be controlled by a remote server or controller. Each of the MFCs may be a wide range MFC having the ability to perform as either a high flow MFC or a low flow MFC. The controller may be configured to control and change the flow rate of a gas in each of the MFCs.

The present disclosure further provides, in implementations, a method of using a gas delivery substrate for mounting gas supply components of a gas delivery system for a semiconductor processing apparatus for supplying process gas to a processing chamber of a plasma processing apparatus. Such a method may include, for example, delivering different gases between gas supply components mounted on the substrate through conduits within the substrate to a mixing manifold or chamber within the substrate. Initially, the gases are delivered to the substrate through a plurality of gas inlets on a surface of the substrate. After mixing within a mixing manifold or chamber, the gases exit the substrate through one or more outlets. The gas inlets may be equally spaced from a center mixing chamber of the mixing manifold, such that the length scale of each gas species is the same and when gas is flowed from gas supplies to the mixing manifold within the substrate, the gas delivery time for each gas is the same. Alternatively, the gas supply components and gas inlets may be spaced in linear or non-linear arrangements.

Such a method may further include, for example, delivering gas through a gas delivery substrate including a first layer having vertical through-holes, a second layer having vertical through-holes and horizontal gas channels, and a third layer having vertical through-holes. The first, second, and the third layers of the substrate may be bonded together such that the horizontal gas channels of the second layer may be in fluidic communication with at least some of the vertical through-holes in the first layer and/or the third layer. The method further includes delivering the gas between a plurality of gas supply components via the second layer and the first layer and/or the third layer of the substrate. In addition, the gas delivery substrate may include one or more openings for allowing gas to exit the substrate to one or more gas lines or to a downstream processing chamber.

In addition, the present disclosure provides a method of supplying process gas through a gas delivery substrate for mounting gas supply components to a processing chamber of a plasma processing apparatus. Such a method may include, for example, delivery of gases from a plurality of gas supplies in fluidic communication with a plurality of gas inlets on a surface of a substrate for mounting gas supply components and having at least one mixing chamber and an outlet therefrom; flowing at least two different gases from the plurality of gas supplies to the substrate to create a gas mixture in the mixing chamber; and supplying the gas mixture to a plasma processing chamber fluidically coupled with the gas delivery substrate downstream of the substrate. In some implementations, the gas mixture may be combined with a tuning gas before delivery to a downstream processing chamber.

In some such implementations, mass flow controllers may initiate flow set points for each of the at least two different gases and release them simultaneously for immediate mixing in a mixing chamber within the substrate. One of the gases may be a tuning gas which may be delivered to the mixing chamber.

In some implementations, gas may enter the substrate via a plurality of gas inlets/openings on a surface of the substrate and enter a mixing chamber within the substrate. The gas mixture may then exit the substrate via one or more exit outlets/openings from the mixing chamber. After exiting the substrate, the gas may be delivered to one or more gas lines, or directly to a processing chamber. The mixing chamber may be provided within one or more layers of the substrate or be external to the substrate. In other implementations, the gas may be added to another array of gases or mixed gases, another substrate mounted with gas supply components, or a gas stick.

It is to be understood that the above monolithic or layered substrate concepts may allow the components for controlling multiple different process gases of a semiconductor processing tool to be mounted to the same component, i.e., the monolithic or layered substrate. In previous gas distribution systems for semiconductor processing tools, each process gas was typically handled by a discrete gas stick, i.e., the valves, mass flow controller(s), etc. for controlling each gas flow were mounted to a separate substrate, which, in some instances, was built up from modular substrate elements as shown in FIG. 3. In some typical arrangements, such separate gas sticks (and their separate substrates) were then arranged in a linear array, with each gas stick teeing into a common mixing line (as opposed to a much smaller mixing chamber). As a result, the mixing volume for a conventional gas box was typically provided by a long tube or flow channel that is connected to each gas stick in the linear array—thus, the mixing volume in a conventional gas box may be a tube or flow passage that is at least as long as the width of the side-by-side gas sticks, in aggregate. For example, if each gas stick is 1.5" in width, and there are 16 gas sticks, then the mixing volume in a conventional system may be a gas passage that is at least 24" in length; if the gas passage is a nominal 0.25" in diameter along this length, then the mixing volume of such a passage is greater than 4.7 cubic inches.

In comparison, a monolithic or layered substrate, as disclosed herein, may allow for radial arrays of gas flow components and flow passages, which, in turn, allows for a mixing volume that may be concentrated in a much smaller area and thus be much smaller in volume, e.g., less than a cubic inch. This smaller mixing volume size reduces purge times, as well as the time needed to effectively mix the gases flowed into the mixing chamber. Another benefit offered by a radial array of gas flow components, as discussed above, is that the final transit distance between the mixing chamber and the last fluid flow component for each process gas flow path may be made equal for each process gas, which makes the transit times of each process gas to the mixing chamber insensitive to the radial positioning of the terminal gas flow components for that process gas in the gas flow component array.

It is to be understood that layered substrates, as described herein, may allow for most or all of the gas flow components downstream of the primary shut-off valve, i.e., most or all of the gas flow components typically included in a gas stick, for most or all of the process gas supply lines for a gas distribution system to be mounted to one common substrate. For example, in a gas distribution system that distributes 16 separate gases using a layered substrate component, the gas flow components for 12, 14, or 16 of these gases may be mounted to the same substrate.

Special Considerations for Ceramic Substrates

As discussed above, the multi-layered substrate gas distribution systems described herein may, in some implementations, be made from ceramic layers that are bonded together or otherwise manufactured such that exterior surfaces of the substrate are ceramic. However, ceramic materials present some unique manufacturing challenges that may introduce complexities in the manufacture of such substrates that are not issues when making such substrates out of more conventional materials, such as machinable metals.

Ceramics are sintered materials, i.e., a powdered ceramic material is shaped into a form of some sort and then heated or "fired" at high temperature to fuse the ceramic particles into a cohesive solid. In the unfired or "green" state, ceramics are typically low-strength and may be readily machined. In the fired state, ceramics are much stronger but typically also more brittle. Moreover, in the firing process, most ceramic materials experience significant shrinkage, e.g., ~20%. Such shrinkage may not be uniform, which may introduce additional issues.

The machining of green ceramics may be performed using traditional machining techniques, e.g., milling, boring, drilling, etc., or by more advanced techniques, such as laser cutting. These techniques may, however, may leave a rough surface finish. For example, in laser cutting, outgassing from the laser cutting process may cause fluctuations in the laser beam intensity, width, and focusing, which may result in small surface irregularities that result in a rough surface finish. The granular nature of the green ceramic may also contribute to increased surface roughness in a ceramic part, as compared with a machined metal part—even if the ceramic is machined using traditional techniques.

Sealing

One issue that arises in using a gas distribution system featuring a ceramic substrate is the issue of mounting flow control components, such as valves, mass flow controllers, etc. having, for example, surface-mount valve interfaces, to the ceramic substrate such that a gas-tight seal exists between the flow control components and the ceramic substrate. In a traditional gas stick arrangement, metal C-seals or other crushable, metal seals are typically used for such purposes; the crushable metal seals are interposed between the metal bases of the gas flow components and the metal substrates used in such traditional gas stick arrangements and then compressed, which deforms the seals and forms a gas-tight seal interface. Thus, the sealing interface in a traditional gas stick arrangement is typically a metal-metal contact arrangement. Such sealing interfaces are typically provided by providing a shallow counterbore feature, typically sized based on the outer diameter of the crushable metal seal, on both the gas flow component base and the metal substrate. The discussion herein relating to sealing surfaces may be applied to seals utilizing a variety of different crushable metal seals, including C-seals, W-seals, and other seal types. Although the following discussion and examples feature C-seals, it is to be understood that the seal face preparation techniques discussed herein also may be applied to seals utilizing other types of crushable metal seals.

Figure 18:
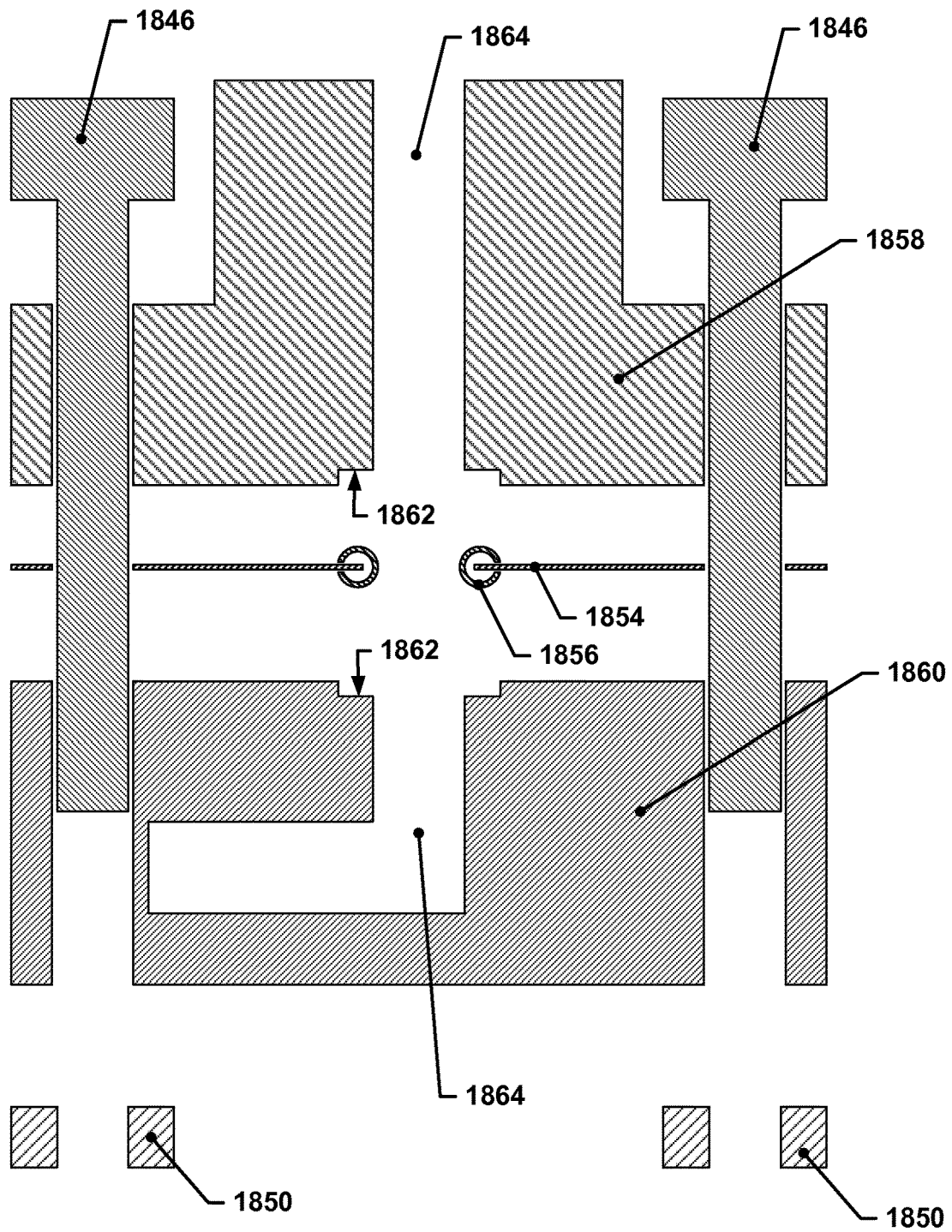
FIG. 18 depicts an exploded section view of a typical C-seal interface between a gas supply component and a metal base.
Figure 19:
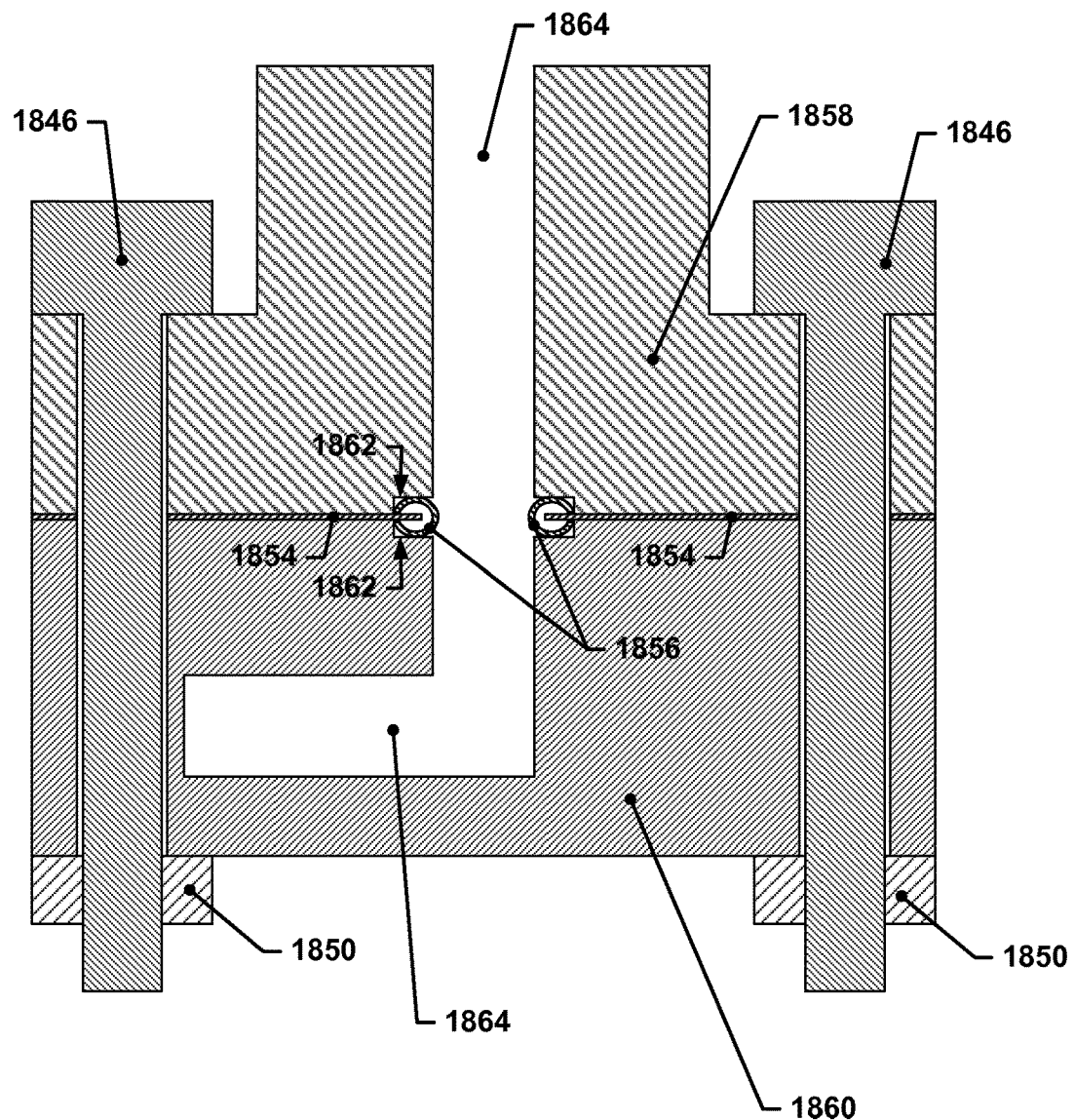
FIG. 19 depicts a section view of the assembled C-seal interface of FIG. 18.

FIG. 18 depicts an exploded section view of a typical C-seal interface between a gas supply component and a metal base. FIG. 19 depicts a section view of the assembled C-seal interface of FIG. 18. A gas supply component 1858, which may be made of metal, may be bolted to a metal base 1860; the gas supply component 1858 and the metal base 1860 may each have corresponding ports 1864; the gas supply component in this example is held in place with respect to the metal base 1860 by bolts 1846, which are threaded into nuts 1850. The gas supply component 1858 and the metal base 1860 both have counterbore features 1862 that are sized to receive a metal C-seal 1856, which may be snapped into a seal retainer 1854 that may hold the metal C-seal 1856 in place during assembly and may ensure that the metal C-seal 1856 is properly seated before being compressed when the gas supply component 1858 is clamped to the metal base 1860.

For gas-tight connections, the surfaces of such counterbore features that seal against the crushable metal seals, e.g., the flat floors of the counterbore features, are typically burnished to a surface roughness of 8-16 μin Ra to provide a gas-tight connection for smaller-molecule gases such as helium, hydrogen, and Freon, or 16-32 μin Ra to provide a gas-tight connection for larger-molecule gases such as air, nitrogen, argon, and natural gases. Surface finishes that are smoother than 8 μin Ra may actually impair sealing, and are thus not recommended by manufacturers of crushable metal seals (see, for example, "Surface Roughness Recommendations" on page E-80 of the "Metal Seal Design Guide" published by Parker Hannifin Corporation in July 2013).

The present inventors, however, determined that in the context of a ceramic/crushable metal seal interface, the ceramic portion of the interface may actually benefit from having a surface roughness range that is outside of the typical recommended surface roughness ranges. In testing ceramic interfaces to metal C-seals, the present inventors discovered that ceramic surfaces having surface roughnesses in the range of surface roughnesses recommended by the C-seal manufacturer did not provide a sufficiently leak-proof interface according to SEMI F1 standards. SEMI is a global industry association for the semiconductor manufacturing industry and publishes a collection of standards governing various aspects of semiconductor manufacturing equipment. The F1 standard (as of this writing, the F1-0812 standard) is titled "Specification for Leak Integrity of High-Purity Gas Piping Systems and Components," and requires a "leak-tight" seal to have an inboard leak rate of less than $10^{-9}$ $cm^3$ atmospheric He/sec. The present inventors determined that the failure of industry-standard metal C-seal interfaces to achieve such leak rates when used to seal against a sintered ceramic surface was likely due to the fact that sintered ceramic materials are porous, whereas metal sealing surfaces are not. The present inventors decided to polish the ceramic surface that seals against the metal C-seal to a surface roughness of 5 μin Ra or better, which is more than 30% smoother than the minimum manufacturer-recommended surface roughness. The resulting ceramic seal interfaces were tested with both standard 316L stainless steel C-seals and harder Hastelloy® C-22 C-seals, and each exhibited leak characteristics meeting the SEMI F1 standards for over 50 assembly-disassembly cycles (the metal C-seals used were replaced after each cycle, as such seals are not re-usable). This unexpected result suggests that standard crushable metal seals may be used with a ceramic sealing surface by polishing or lapping the ceramic sealing surface to a surface roughness that is considerably smoother than the typical manufacturer surface roughness recommendation.

Figure 20:
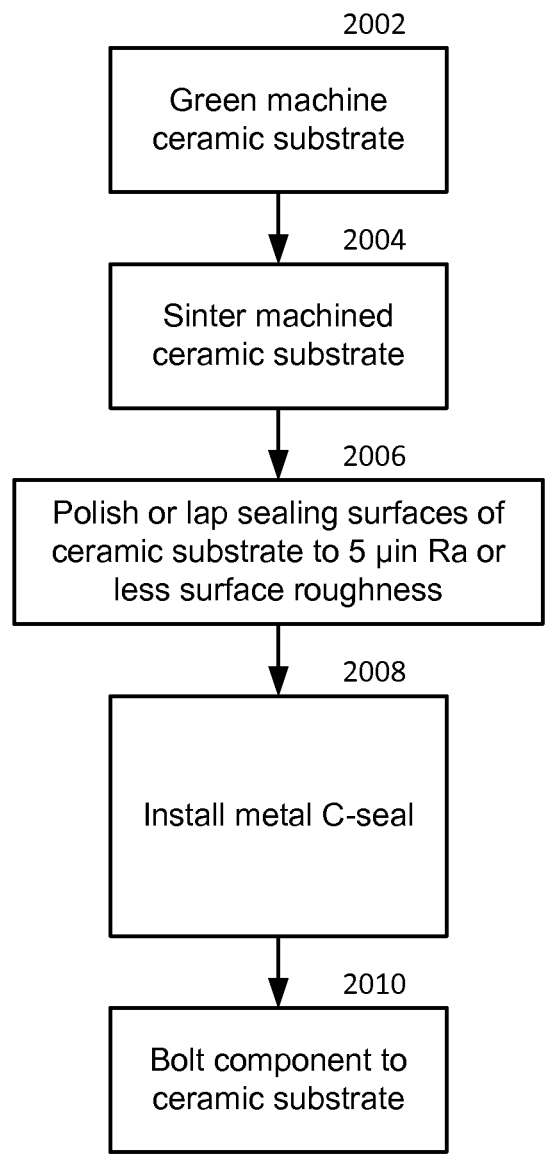
FIG. 20 depicts a flow diagram for a technique for preparing a ceramic substrate for interfacing with a gas flow component using a standard crushable metal seal, such as a metal C-seal.

FIG. 20 depicts a flow diagram for a technique for preparing a ceramic substrate for interfacing with a gas flow component using a standard crushable metal seal, such as a metal C-seal. In block 2002, a ceramic substrate, or layers thereof, may be machined, e.g., machined in a green state, so as to have a number of gas flow channels and holes passing through the ceramic substrate that fluidically connect the channels with the exterior surface(s) of the ceramic substrate. In block 2004, the ceramic substrate (or stacked layers thereof) may be fired in a kiln or oven in order to sinter the ceramic material used into a monolithic block. In block 2006, the surfaces of the ceramic substrate where metal C-seals will be interfaced may be polished to a surface roughness less than or equal to 5 µin $R_a$. In block 2008, a crushable metal seal may be located relative to a hole located either in the ceramic substrate or in a gas flow component. In block 2010, the gas flow component may be mounted to the ceramic substrate, e.g., using a bolted connection, and then clamped in place, sandwiching the crushable metal seal between the polished or lapped portion of the ceramic substrate and the base of the gas flow component.

In some implementations, the ceramic substrate may, similar to conventional seal interfaces on steel components, have individual counterbores sized to receive a crushable metal seals, and the "floors" of such counterbores may be individually polished to achieve the 5 µin $R_a$ or less surface roughness discussed above. If there are a multitude of such features, as will typically be the case in a multilayer substrate such as those discussed above, this may be time-consuming. An alternative approach is to forego individual counterbore features on the substrate, and instead simply polish or lap the entire surface(s) on which the gas flow components are to be mounted to the desired 5 µin $R_a$ or less surface roughness. A separate template or templates, such as templates 1614 in FIG. 17, which may be made of metal, ceramic, or other material, that is sized with a thickness that is similar to the depth of a "typical" counterbore feature used to receive a metal seal may be laid on top of the mounting surface(s) and interposed between the gas flow components and the substrate. The template may have holes in locations corresponding to the holes in the ceramic substrate; these holes may be sized slightly larger than the outer diameter of the metal seals, and may serve to locate the metal seals relative to the holes in the ceramic substrate to which the gas flow components are being sealed. If this technique, which is described in more detail in U.S. patent application Ser. No. 14/843,775, filed on Sep. 2, 2015, which is hereby incorporated by reference in its entirety, is used, then the desired surface roughness for all of the seal interfaces on a common side of the ceramic substrate may be achieved using a single polishing or lapping operation on the entire side surface.

Figure 21:
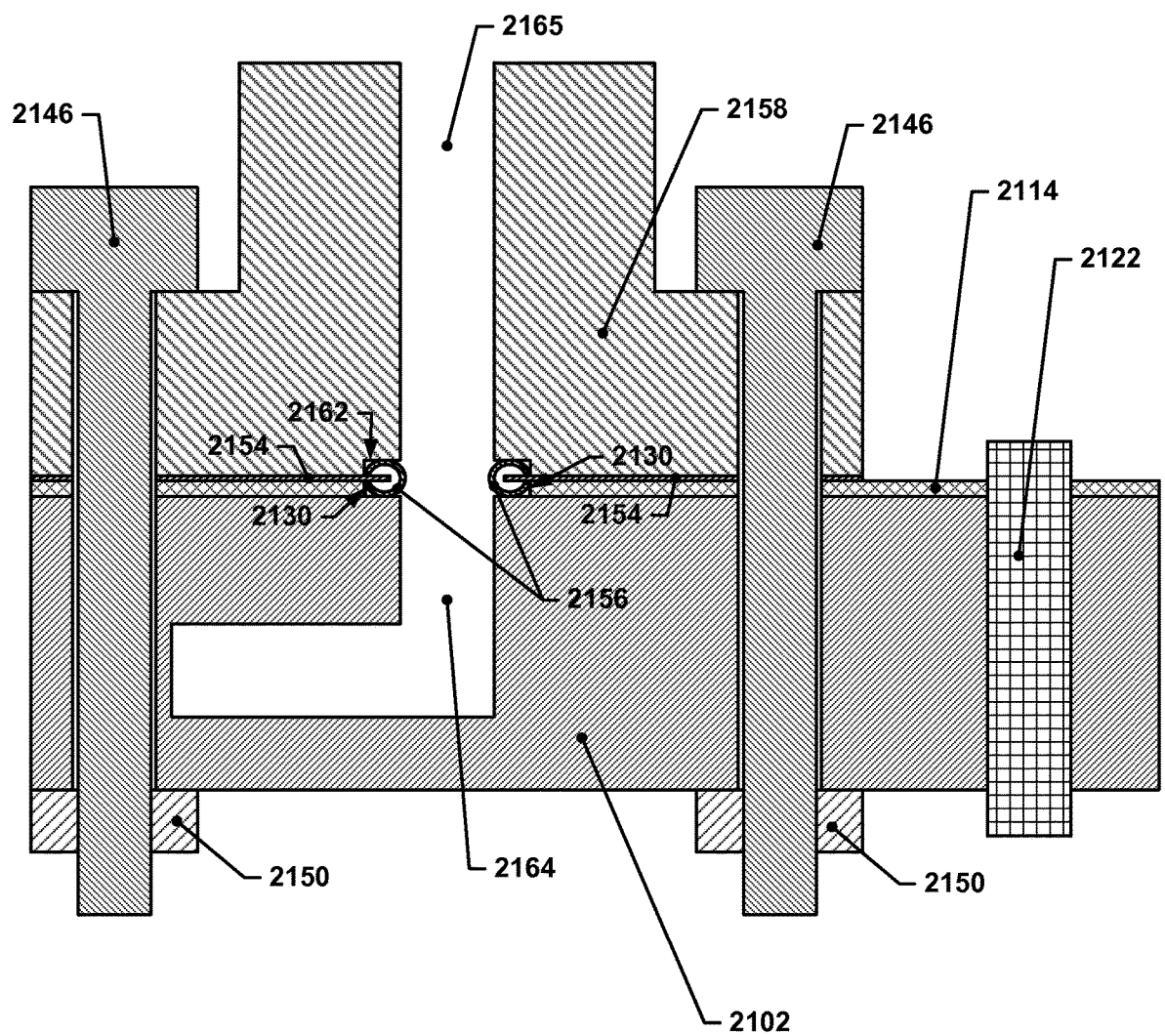
FIG. 21 depicts a cross-section of an arrangement in which the entire surface of a ceramic substrate may be polished or lapped to a surface roughness of less than or equal to 5 µin $R_a$.

FIG. 21 depicts a cross-section of an arrangement in which the entire surface of a ceramic substrate may be polished or lapped to a surface roughness of less than or equal to 5 µin $R_a$. As can be seen, the upper surface of a ceramic substrate 2102 may be flat, allowing for the entire upper surface of the ceramic substrate 2102 to be polished or lapped at once to a surface roughness of less than or equal to 5 µin $R_a$. After this surface roughness is achieved, a component-locating template 2114 may be placed on the ceramic substrate 2102 and lined up with a gas flow port 2164 on the ceramic substrate, such as the gas flow port depicted. Such alignment may be achieved by lining up a reference feature or features on the template with corresponding reference features, such as a pin 2122, in the ceramic substrate 2102—this may allow the template to be aligned with multiple gas flow ports simultaneously. After the component-locating template 2114 is placed on the ceramic substrate, a metal C-seal 2156 may be installed in a counterbore formed by a hole 2130 in the component-locating template 2114 that is of a larger diameter than the gas flow port in the ceramic substrate 2102 upon which the hole is centered. A seal-locating template 2154 may assist with placement of the metal C-seal 2156. Once the metal C-seal 2156 is installed, a gas flow component 2158 having a counterbore 2162 around a port 2165 may be located on the metal C-seal and installed using bolts 2146 and nuts 2150, for example.

Particulate Control

Another issue that arises in the use of ceramic substrates in the gas distribution context is that of particulate contamination. As discussed earlier, sintered ceramics have high porosity, which may cause the raw, machined surface finishes of sintered ceramic components to exhibit increased surface roughness as compared with a machined metal substrate. Moreover, if a technique such as laser cutting is used to shape the channels in a multi-layer ceramic substrate, the resulting sidewall roughness of the channels (the side walls of the channels are generally parallel to the laser beam path) may be considerably rougher due to fluctuations in the laser beam intensity and/or width as a result of outgassing. Laser cutting is a fast and cost-effective technique that may be used to create the two-dimensional layers that may be used in the manufacture of a layered ceramic substrate. In testing performed by the present inventors, gas channel sidewall surface roughness arising from laser cutting of the channels was measured to be on the order of 185 to 255 µin $S_a$ (area-based average roughness), as compared with surface roughnesses of 20 to 28 µin $S_a$ for the bottoms or tops of such channels, which were provided by the surfaces of adjacent layers in the layered ceramic substrate and which were not laser cut.

The high surface roughness of the channel sidewalls presents a problem in that surfaces of such a high surface roughness are more likely to a) trap and retain particulates and b) more likely to be sources of particulates themselves, e.g., if a ceramic particle that contributes to the high surface roughness breaks off from the surface. For example, in testing, it was determined that the particulate purging time for a ceramic substrate was more than twice as long as the particulate purging time for an equivalent stainless steel gas distribution manifold (although the stainless steel manifold was made with stainless steel tubing rather than as a layered substrate). In particulate purging time tests, a purge gas is flowed through the gas flow system being tested and the time it takes until any particles that may be in the exiting gas flow are less than a certain size is evaluated. In the testing that was done, the time it took until only particles of less than 100 nm in size exited the substrate was used to determine the particle purging time.

The present inventors determined that subjecting a sintered ceramic substrate for use in a gas distribution system to a coating process may be an effective way to improve the surface finish within the channels and reduce or prevent particulate contamination. The coating may serve two purposes: a) to trap any existing particles, e.g., ceramic particles that may not have effectively fused with neighboring ceramic particles during the sintering process, and b) to fill in the gaps and crevices that may exist between sintered ceramic particles, thereby reducing the available surface area on which particulates from elsewhere in the gas system may temporarily get caught or snagged.

Several different types of coatings may be used for such purposes, including glaze coatings, chemical vapor deposition (CVD) coatings, and atomic layer deposition (ALD) coatings, as well as other coating types that may provide the functionality discussed above.

In glaze coatings, a silica- or alumina-containing material may be applied to the exposed surfaces of a ceramic part and the ceramic part may then be exposed to high heat in a kiln or other oven, melting the silica-containing material. When the melted silica glaze re-cools, it will, due to being in a molten liquid state, have flowed into the gaps and crevices of the ceramic part, and will form a more rounded, smoother profile when it solidifies. Particulates that may have been lodged in the crevices and gaps of the ceramic part may be cemented in place by this coating. Glazes may be applied through any of a variety of techniques, including by dry-dusting the channels and other surfaces of interest with the glaze material prior to insertion into a kiln, inserting glaze materials in the kiln or oven such that the glaze material migrates into the kiln atmosphere and thus transfers to the part to be glazed, or by suspending the glaze materials in an aqueous suspension, flowing the suspension through the channels, and then firing the ceramic component in the kiln.

In CVD coating operations, the ceramic substrate may be placed in a CVD chamber and exposed to a chemical vapor deposition environment that deposits a polymer coating, such as a Parylene™ coating, or other generally non-reactive coating, such as, for example, a silicon or alumina coating, on surfaces of the ceramic substrate. In such operations, it may be beneficial to draw a vacuum on the passages of the ceramic substrate during the coating operation to draw the CVD gases into the channels to ensure that the CVD coating is applied to the channels within the interior of the ceramic substrate. For example, if the ceramic substrate is supported by a pedestal within the CVD chamber, the pedestal may have one or more vacuum ports that may correspond in location with locations in the exterior surface of the ceramic substrate with ports leading the channels within the ceramic substrate. During processing operations, vacuum drawn on these ports may draw CVD gases into the channels, ensuring that they are coated with the CVD coating.

Polymer coatings, while very compatible with CVD processes, are somewhat fragile, and may be easily damaged. For example, if a polymer coating from a channel extends along the interior surfaces of a through-hole connecting that channel to an exterior surface of the ceramic substrate, and then extends to the exterior surface of the ceramic substrate, the polymer coating may, when a gas flow component that is mounted to that exterior surface of the ceramic substrate is removed for maintenance, stick to the gas flow component (or the metal seal that seals the gas flow component to the ceramic substrate) and pull away from the sidewalls of the through-hole when the gas flow component is removed. Each time the gas flow component is removed, there may be a potential for further damage to the coating, and gas flow components may need to be removed many times during the lifetime of the gas distribution system.

Figure 23:
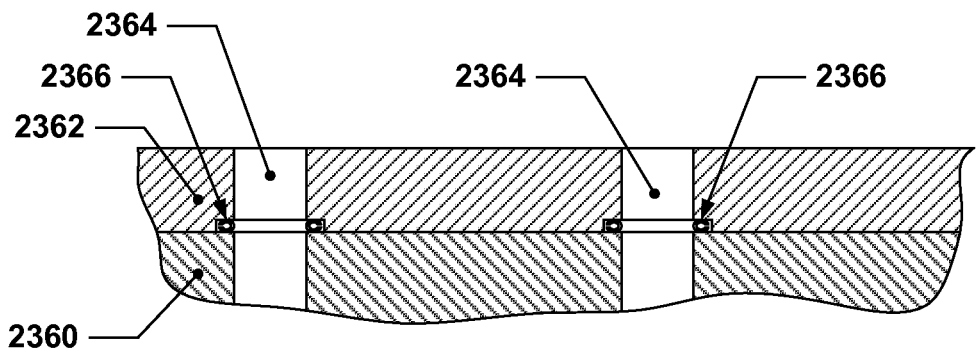
FIGS. 23 through 25 depict simplified cross-sectional views of a ceramic substrate and masking components during various stages of a CVD coating application.
Figure 24:
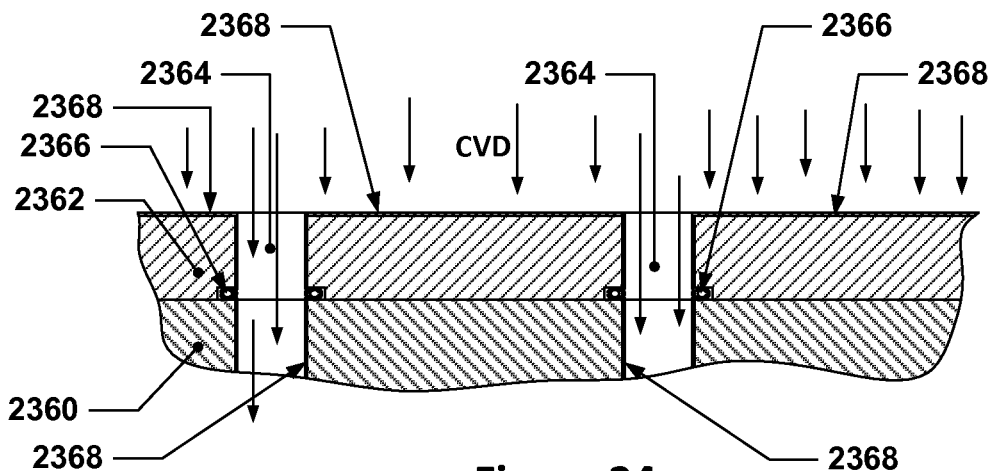
Figure 25:
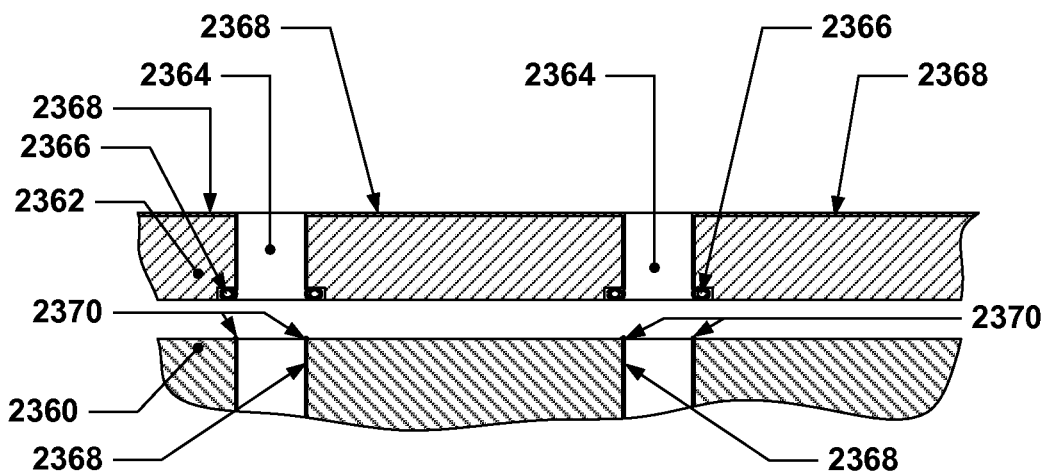

To avoid such potential issues with a CVD coating, the majority of the surfaces of the ceramic substrate to which gas flow components may be mounted may be kept free of the coating through appropriate masking. FIGS. 23 through 25 depict simplified cross-sectional views of a ceramic substrate and masking components during various stages of a CVD coating application. For example, in FIG. 23, a plate or template 2462 may be placed against a ceramic substrate 2360. The plate or template 2362 may have through-holes 2364 in it corresponding to the locations of each drop-hole or through-hole on an exterior surface of the ceramic substrate and may be placed over the ceramic substrate 2360 such that the through-holes 2364 on the plate or template line up with the corresponding drop-holes or through-holes in the ceramic substrate 2360. The plate or template 2362 may, for example, be made of any suitable material, e.g., alumina, stainless steel, etc., and may include counterbores for locating seals 2366 that seal against the ceramic substrate 2360 at each drop-hole or through-hole location. When the plate or template 2362 is placed against the ceramic substrate 2360, these seals 2366 may be interposed between these two components at each drop-hole or through-hole location. In CVD operations, which typically occur at temperatures of several hundred degrees, metal seals may be used due to the high heat. The template or plate may then be fixed in space relative to the ceramic substrate, e.g., by bolting the two pieces together. Thus, when CVD process gases are flowed into the CVD process chamber, such as in FIG. 24, and into the passages within the ceramic substrate 2360, the exterior surface of the ceramic substrate to which the template or plate is mounted may be "masked" off by the template or plate, thereby preventing CVD of the coating 2368 on the ceramic substrate 2360 in the masked locations. When CVD processing is complete, then the template or plate 2362 may be removed, as shown in FIG. 25. During removal, the CVD coating 2368, which may have formed a generally conformal coating along the inside surfaces of the flow paths that bridge between the ceramic substrate 2360, the metal seals 2366, and the template or plate 2362, may break, tear, or otherwise experience an uncontrolled termination event at the ceramic substrate 2360/seal 2366 interface. However, for future assembly/disassembly operations of gas flow components to the ceramic substrate, there will be minimal or no contact between the terminated ends 2370 of the coating(s) and the metal seals that may be used to mount such gas flow components to the ceramic substrate, which may reduce the risk of further damage to the coatings.

In typical ALD coating operations, a first reactant may be flowed into a reactant chamber, usually followed by a purge cycle, and then a second reactant may be flowed into the reactant chamber. The reactants typically react with the exposed surfaces of whatever component is in the chamber in a self-limiting way to produce a single-molecule thick layer. By keeping the first reactant and the second reactant flows separate, each reactant flow may only react with the single-molecule thick layer of the previous reactant on the component that is exposed to the chamber atmosphere. As a result, ALD coatings are 100% conformal, but must be manufactured one molecular layer at a time; this may require hundreds (or thousands) of repetitions of the first and second reactant deposition cycles to achieve a desired thickness, which means that ALD coating operations are typically far more time-consuming than CVD coating operations. Due to the conformal nature of ALD films, however, they form highly durable coatings. ALD may also be used to form nitride, alumina, or other ceramic coatings, allowing for the ceramic substrate channels to be coated in the same material that may be used to form the ceramic substrate.

The thickness of the layers formed on the surfaces of the gas flow channels within a ceramic substrate may be selected such that the layer thickness is either greater than the surface roughness, e.g., for a surface roughness of 250 µin $S_a$, the thickness may be 250 µin or greater, or greater than the smallest particle size used in the manufacture of the ceramic substrate, e.g., if 100 nm diameter ceramic particles were sintered to form the ceramic substrate, then the coating may be at least 100 nm thick. Such coatings may "glue" potentially loose particles in place, and may also fill in crevices and gaps that may otherwise act to trap additional particulates. In some instances, it may not be econominally feasible to achieve such layer thicknesses, e.g., if ALD is used to provide the coating, the cost of performing sufficient ALD cycles to achieve the desired coating thickness may be prohibitive. In such cases, a thinner surface coating may be used, although such a thinner surface coating may exhibit poorer particulate performance.

Figure 22:
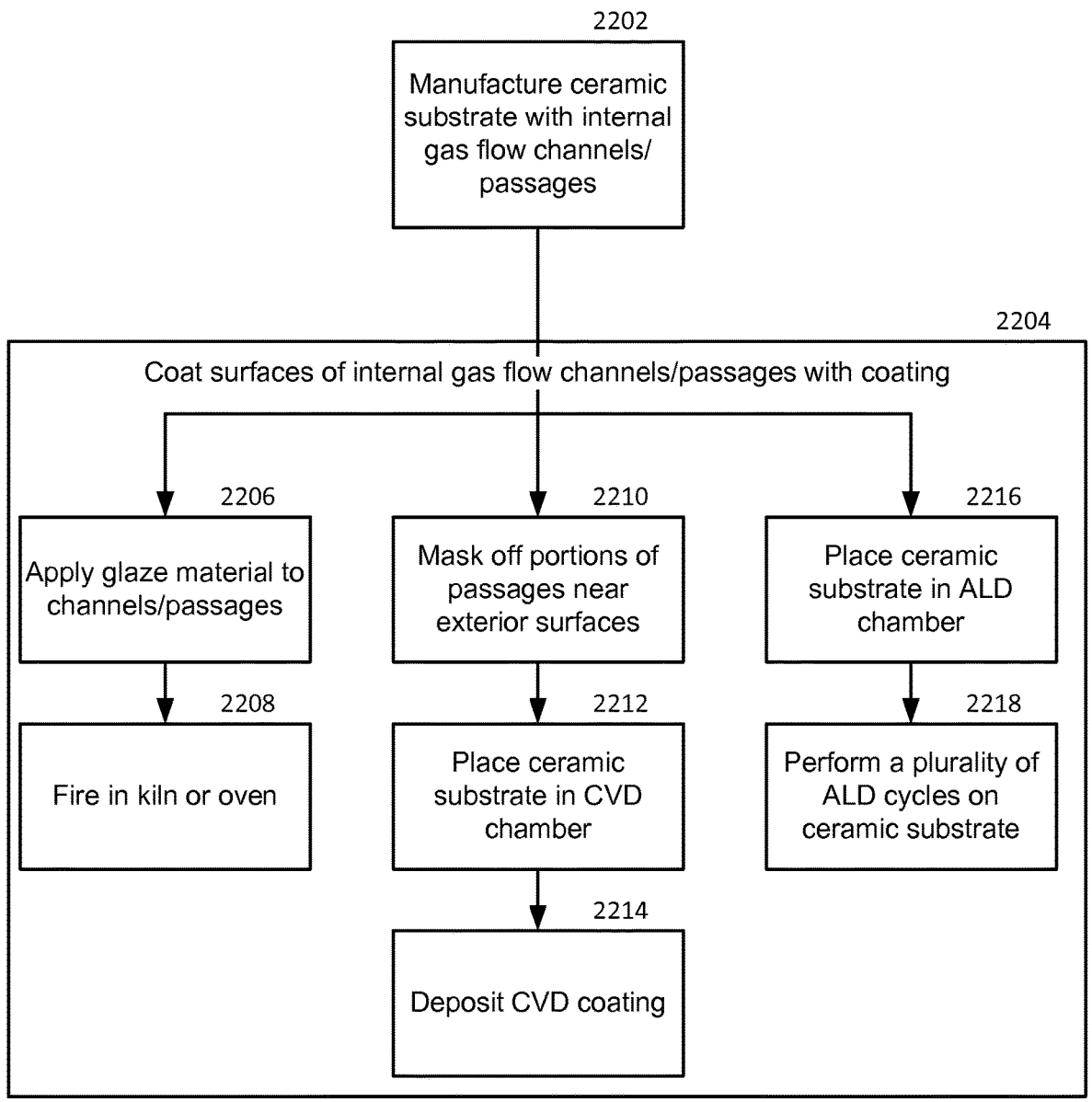
FIG. 22 depicts a flow diagram for a technique for preparing a ceramic substrate for a semiconductor tool gas distribution system so as to have a reduced likelihood of particulate contamination.

FIG. 22 depicts a flow diagram for a technique for preparing a ceramic substrate for a semiconductor tool gas distribution system so as to have a reduced likelihood of particulate contamination. In block 2202, a ceramic substrate for a gas distribution system of a semiconductor processing tool may be manufactured. Such manufacture, for example, may by way of techniques discussed herein, or by other techniques not discussed herein. The ceramic substrate resulting from block 2202 may generally be "complete," in the sense that it has already been sintered and, in most cases, machined, if necessary. In block 2204, the ceramic substrate may be coated with a corrosion-resistant coating to a desired depth, e.g., at least as large as the smallest, nominal size of ceramic particles used in the manufacture of the ceramic substrate or to a depth equivalent to the maximum surface roughness of the walls of the interior flow channels or passages of the ceramic substrate.

The coating operations of block 2204 may be provided by any suitable technique, including the three specific techniques shown. For example, if glazing is used, a silica-containing glaze may be added in block 2206 to the gas flow channels and other interior passages within the ceramic substrate, e.g., through flowing aqueous glaze through the flow channels, applying dry glaze materials to the flow channels, or, alternatively, applying the glaze in the subsequent block via salt-firing the ceramic substrate.

In block 2208, the glazed ceramic substrate may be fired in a kiln or oven to a temperature above the melting point of the glaze, but below the melting point of the ceramic substrate. The glaze may then melt and fuse with the ceramic substrate; once the glaze has been melted, the ceramic substrate may be removed from the kiln or oven and cooled, leaving a durable, chemically-resistant surface coating on the walls of the gas flow channels and other interior flow passages of the ceramic substrate that cements existing particles in place and provides less potential for trapping new particles that may be flowed into the ceramic substrate during use.

If a CVD process is used to provide the coating instead, then the ceramic substrate may optionally be prepared in block 2210 by masking off portions of the internal passages that are near the exterior surfaces of the ceramic substrate on which gas flow components may be mounted. For example, for each vertical through-hole that reaches the exterior surface of the ceramic substrate, a millimeter or so of that vertical through-hole that is closest to the exterior surface of the ceramic substrate may be masked off to avoid depositing the CVD material, e.g., a polymer, on that portion of the vertical through-hole. This may avoid potential damage to the CVD coating caused by interactions with other components that are mounted to the ceramic substrate.

In block 2212, the ceramic substrate may be placed into a CVD chamber. In some implementations, the ceramic substrate may be one of several ceramic substrates that are placed into the same CVD chamber and coated simultaneously (batch-coating ceramic substrates may also be done if glazing or ALD coatings are pursued).

In block 2214, the ceramic substrate may be subjected to a CVD process in which a polymeric coating is deposited on the surfaces of the gas flow passages within the ceramic substrate. In some implementations, the entire ceramic substrate (except for the areas that may be potentially masked) may be subjected to the CVD operation. The CVD process may be performed for a duration of sufficient length that the desired thickness of coating within the interior passages of the ceramic substrate is obtained.

If an ALD process is used to provide the coating, then the ceramic substrate may be placed in an ALD process chamber in block 2216, potentially with additional ceramic substrates that may be coated simultaneously. After the ceramic substrate is placed in the ALD process chamber in block 2216, the ceramic substrate may be subjected to a plurality of ALD cycles in block 2218 until the coating on the surfaces of the internal passages of the ceramic substrate have reached the desired thickness.

It is to be understood that for ALD-applied coatings, a similar masking technique may be used as in CVD coatings, although re-usable rubber o-ring seals may be used in place of metal seals since ALD processes are often performed at much lower temperatures. While most ALD coatings may not be at risk of damage from mounting or dismounting gas flow components, it may be preferable nonetheless to institute a form of masking, similar to that described above with respect to CVD, and to confine the ALD process gases such that only a subset of the surfaces of the ceramic substrate, e.g., the interior passage surfaces, are coated with an ALD coating. This may avoid subjecting the entire ceramic substrate to repeated ALD cycles, which may decrease the amount of time needed to purge each ALD process gas prior to initiating the next ALD cycle. For example, if the ALD process gases are confined so as to only flow into the internal passages of the ceramic substrate, it may generally only be necessary to purge those same passages, as compared with, for example, the larger process chamber volume. This may greatly decrease the time needed to form a coating of a desired thickness.

While implementations disclosed herein have been described in detail with reference to specific implementations thereof, it will be apparent to those skilled in the art that various changes and modifications may be made, and equivalents employed, without departing from the scope of the appended claims.

What is claimed is:

1. A method comprising:
   obtaining a surface mount gas flow component having one or more gas flow ports;
   obtaining a ceramic substrate having a first side and second side opposite the first side and including a surface-mount valve interface, the surface-mount valve interface configured to receive the surface-mount gas flow component and located on the first side, wherein the surface-mount valve interface includes a) two or more mounting holes in the ceramic substrate for receiving mounting fasteners for fixedly mounting the surface-mount gas flow component and b) one or more drop-holes, each drop-hole of the one or more drop-holes extending into the ceramic substrate and fluidically connected within the ceramic substrate with a corresponding gas flow channel that is located within the ceramic substrate and that follows a path that includes one or more segments that extend along one or more directions parallel to the first side, wherein each drop-hole of the one or more drop-holes has a corresponding seal region immediately adjacent thereto;

lapping or polishing at least each seal region of the one or more seal regions such that the surface roughness of that seal region is less than or equal to 5 μin $R_a$;

placing, after the lapping or polishing, a crushable metal seal around each drop-hole of the one or more drop-holes such that the crushable metal seal is in contact with the seal region immediately adjacent to that drop-hole;

placing the surface-mount gas flow component against the first side with the one or more crushable metal seals interposed between the first side and the surface mount valve component and such that each gas flow port of the one or more gas flow ports of the surface-mount gas flow component aligns with a corresponding drop-hole of the one or more drop-holes;

compressing each crushable metal seal of the one or more crushable metal seals against a corresponding seal region of the one or more seal regions.

2. The method of claim 1, further comprising:
clamping the surface-mount gas flow component to the ceramic substrate using two or more fasteners, thereby compressing each crushable metal seal of the one or more crushable metal seals against the seal region of the one or more seal regions with which it is in contact.

3. The method of claim 2, wherein each crushable metal seal of the one or more crushable metal seals is selected from the group consisting of: a C-seal, a W-seal, and a metal O-ring.

4. The method of claim 2, wherein:
at least one drop-hole of the one or more drop-holes is counterbored such that the corresponding crushable metal seal is at least partially recessed within the counterbore of that drop-hole when installed, and
the seal region corresponding with the counterbored drop-hole is a floor of the counterbore.

5. The method of claim 1, further comprising lapping or polishing the entire first side to the surface roughness less than or equal to Spin 5 μin $R_a$.

6. The method of claim 1, further comprising:
manufacturing the ceramic substrate;
forming a coating on at least an interior surface of each gas flow channel of the one or more gas flow channels within the ceramic substrate.

7. The method of claim 6, wherein the manufacturing the ceramic substrate comprises:
manufacturing a plurality of ceramic layers,
forming the one or more gas flow channels in one or more of the layers,
bonding the plurality of ceramic layers together, and
sintering the bonded layers to form the ceramic substrate.

8. The method of claim 6, wherein the coating has a thickness greater than or equal to a value selected from the group consisting of: the smallest nominal particle size of ceramic particles used to make the ceramic substrate and the maximum surface roughness exhibited by the surfaces of the one or more channels.

9. The method of claim 6, further comprising:
applying a glaze to an interior surface of each gas flow channel of the one or more gas flow channels,
firing the ceramic substrate in a kiln or oven to melt the glaze, and
cooling the ceramic substrate to solidify the molten glaze and form the coating.

10. The method of claim 6, further comprising:
inserting the ceramic substrate into a chemical vapor deposition (CVD) chamber, and
performing one or more CVD operations on the ceramic substrate to form the coating.

11. The method of claim 10, further comprising:
masking, prior to performing the one or more CVD operations, portions of the first side or the second side to prevent the coating from being deposited on the masked portions.

12. The method of claim 6, further comprising:
inserting the ceramic substrate into an atomic layer deposition (ALD) chamber, and
performing a plurality of ALD operations on the ceramic substrate to form the coating.

13. An apparatus comprising:
one or more crushable metal seals; a surface-mount gas flow component having one or more gas flow ports; and
a ceramic substrate, wherein:
the ceramic substrate has a first side and second side opposite the first side,
the ceramic substrate includes a surface-mount valve interface, the surface-mount valve interface configured to receive the surface-mount gas flow component and located on the first side, wherein the surface mount valve interface includes a) two or more mounting holes in the ceramic substrate for receiving mounting fasteners for fixedly mounting the surface-mount gas flow component and b) one or more drop-holes, each drop-hole of the one or more drop-holes extending into the ceramic substrate and fluidically connected within the ceramic substrate with a corresponding gas flow channel that is located within the ceramic substrate and that follows a path that includes one or more segments that extend along one or more directions parallel to the first side, wherein:
the surface-mount gas flow component is mounted to the ceramic substrate such that each gas flow port of the one or more gas flow ports of the surface-mount gas flow component aligns with a corresponding drop-hole of the one or more drop-holes
each crushable metal seal of the one or more crushable metal seals surrounds the corresponding drop-hole and is interposed between the surface-mount gas flow component and the ceramic substrate,
each drop-hole of the one or more drop-holes has a seal region immediately adjacent thereto that contacts with the crushable metal seal that surrounds that drop-hole,
each seal region of the one or more seal regions has a surface roughness less than or equal to 5 μin $R_a$, and
each crushable metal seal of the one or more crushable metal seals is compressed against the seal region of the one or more seal regions with which it contacts by the surface-mount gas flow component.

14. The apparatus of claim 13, further comprising two or more fasteners, each fastener of the two or more fasteners inserted through a corresponding mounting hole of the two or more mounting holes and tightened so as to compress the surface-mount gas flow component against the first side.

15. The apparatus of claim 13, wherein each crushable metal seal of the one or more crushable metal seals is selected from the group consisting of: a C-seal, a W-seal, and a metal O-ring.

16. The apparatus of claim 15, wherein the ceramic substrate further comprises at least one counterbore feature, wherein:
- each counterbore feature of the at least one counterbore feature corresponds in location to one of the one or more drop-holes,
- each counterbore feature of the at least one counterbore feature has a floor that includes the seal region corresponding to the drop-hole associated with the counterbore feature.

17. The apparatus of claim 15, wherein the entire first side has a surface roughness less than or equal to 5 μin $R_a$.

18. The apparatus of claim 13, wherein:
- the ceramic substrate is made from sintered ceramic particles,
- the one or more gas flow channels have a coating with a thickness greater than or equal to a value selected from the group consisting of: the smallest nominal particle size of ceramic particles used to make the ceramic substrate and the maximum surface roughness exhibited by the surfaces of the one or more channels.

19. The apparatus of claim 13, wherein the one or more gas flow channels have glazed surfaces.

* * * * *